US012718756B2

(12) United States Patent
Kim

(10) Patent No.: US 12,718,756 B2
(45) Date of Patent: Aug. 25, 2026

(54) DISPLAY DEVICE

(71) Applicant: LG Display Co., Ltd., Seoul (KR)

(72) Inventor: Haksu Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 39 days.

(21) Appl. No.: 18/827,413

(22) Filed: Sep. 6, 2024

(65) Prior Publication Data

US 2025/0218359 A1 Jul. 3, 2025

(30) Foreign Application Priority Data

Dec. 29, 2023 (KR) ........................ 10-2023-0196627

(51) Int. Cl.
*G09G 3/3233* (2016.01)
*H10K 59/80* (2023.01)

(52) U.S. Cl.
CPC ......... *G09G 3/3233* (2013.01); *H10K 59/879* (2023.02); *G09G 2300/0819* (2013.01); *G09G 2300/0842* (2013.01); *G09G 2300/0861* (2013.01); *G09G 2310/08* (2013.01); *G09G 2320/068* (2013.01)

(58) Field of Classification Search
CPC ......... G09G 3/3233; G09G 2300/0819; G09G 2300/0842; G09G 2300/0861; G09G 2310/08; G09G 2320/068; G09G 3/3266; G09G 3/20; G09G 3/2074; G09G 2320/028; G09G 2300/0871; G09G 2380/10; H10K 59/879; H10K 59/12; H10K 59/1213; H10K 59/1216; H10K 59/131; B60R 11/0229; B60K 35/00; B60K 2360/1523
See application file for complete search history.

(56) References Cited

U.S. PATENT DOCUMENTS

2017/0154944 A1* 6/2017 Kim ........................ H10D 86/60
2022/0189937 A1* 6/2022 Huo ....................... H01L 25/162
2023/0217690 A1* 7/2023 Hong .................. H10K 59/353 345/173
2023/0317695 A1 10/2023 Liu et al.
2024/0420640 A1* 12/2024 Hwang .................... G09G 3/32
2025/0095550 A1* 3/2025 Choi .................... G09G 3/3266

FOREIGN PATENT DOCUMENTS

CN 104167175 A 11/2014
KR 10-2003-0089483 A 11/2003
TW 202117695 A 5/2021

* cited by examiner

*Primary Examiner* — Nitin Patel
*Assistant Examiner* — Gloryvid Figueroa-Gibson
(74) *Attorney, Agent, or Firm* — Birch, Stewart, Kolasch & Birch, LLP

(57) ABSTRACT

A display device includes a display panel having an active area in which a plurality of sub-pixels are disposed and a non-active area surrounding the active area, and a plurality of level shift circuits disposed in the active area and configured to transmit a mode signal to drive the plurality of sub-pixels in either a first mode or a second mode. Further, each of the plurality of sub-pixels includes a first light emitting element, a first optical member configured to refract light from the first light emitting element, a second light emitting element, and a second optical member configured to refract light from the second light emitting element and having a different shape from the first optical member. As a result, by embedding the level shift circuit for generating the mode signal in the active area, it is possible to reduce a bezel area.

13 Claims, 16 Drawing Sheets

DISPLAY DEVICE

CROSS-REFERENCE TO RELATED APPLICATIONS

This application claims priority to Korean Patent Application No. 10-2023-0196627 filed on Dec. 29, 2023, in the Korean Intellectual Property Office, the entire contents of which is hereby expressly incorporated by reference into the present application.

BACKGROUND

Technical Field

The present disclosure relates to a display device, and more particularly, to a display device capable of controlling a viewing angle.

Discussion of the Related Art

In accordance with the development of technology in modern society, a display device is being used in various ways to provide information to users. The display device is included not only in an electronic signboard that simply transmits visual information in one direction, but also in various electronic devices that need higher technology to confirm a user input and provide information in response to the confirmed input.

For example, the display device can be included in a vehicle to provide various types of information to a driver and passengers of the vehicle. However, the display device of the vehicle needs to display content appropriately so as not to interfere with the operation of the vehicle. For example, the display device needs to limit the display of content that can reduce concentration on driving while the vehicle is in operation.

SUMMARY OF THE DISCLOSURE

An object to be achieved by the present disclosure is to provide a display device capable of controlling a viewing angle, with a minimized bezel.

An object to be achieved by a preferred embodiment of the present disclosure is to provide a display device capable of generating a mode signal using a low voltage signal without a separate high-voltage IC.

Another object to be achieved by a preferred embodiment of the present disclosure is to provide a display device capable of selectively controlling a viewing angle in both row and column directions for a plurality of areas.

Objects of the present disclosure are not limited to the above-mentioned objects, and other objects, which are not mentioned above, can be clearly understood by those skilled in the art from the following descriptions.

According to an aspect of the present disclosure, a display device includes: a display panel including an active area in which a plurality of sub-pixels is disposed and a non-active area adjacent to the active area; and a plurality of level shift circuits (which can be also referred to as level shifters or just "level shifts") disposed in the active area and transmitting a mode signal to drive the plurality of sub-pixels in either a first mode or a second mode, in which each of the plurality of sub-pixels includes: a first light emitting element; a first optical member refracting light from the first light emitting element; a second light emitting element; and a second optical member refracting light from the second light emitting element and having a different shape from the first optical member. As a result, by the first and second optical member, viewing angles of the subpixels and thus a viewing angle of the display device, can be controlled. Besides, by embedding the level shift for generating the mode signal in the active area, it is possible to reduce a bezel area.

Other detailed matters of the example embodiments are included in the detailed description and the drawings.

According to an example embodiment of the present disclosure, by embedding the level shift for generating the mode signal in the active area, it is possible to reduce the bezel area.

According to an example embodiment of the present disclosure, by generating the mode signal using the level shift that uses the same control signal as the signal for driving the sub-pixel circuit, without using the separate integrated circuit (IC, it is possible to reduce manufacturing costs.

According to an example embodiment of the present disclosure, by disposing the level shift in the plurality of areas, it is possible to selectively control the viewing angle in both the row and column directions.

According to an example embodiment of the present disclosure, by allowing the level shift to share the signal line with the sub-pixel circuit to minimize additional lines for driving the level shift, it is possible to prevent line design from becoming complicated.

The effects according to the present disclosure are not limited to the contents exemplified above, and more various effects are included in the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
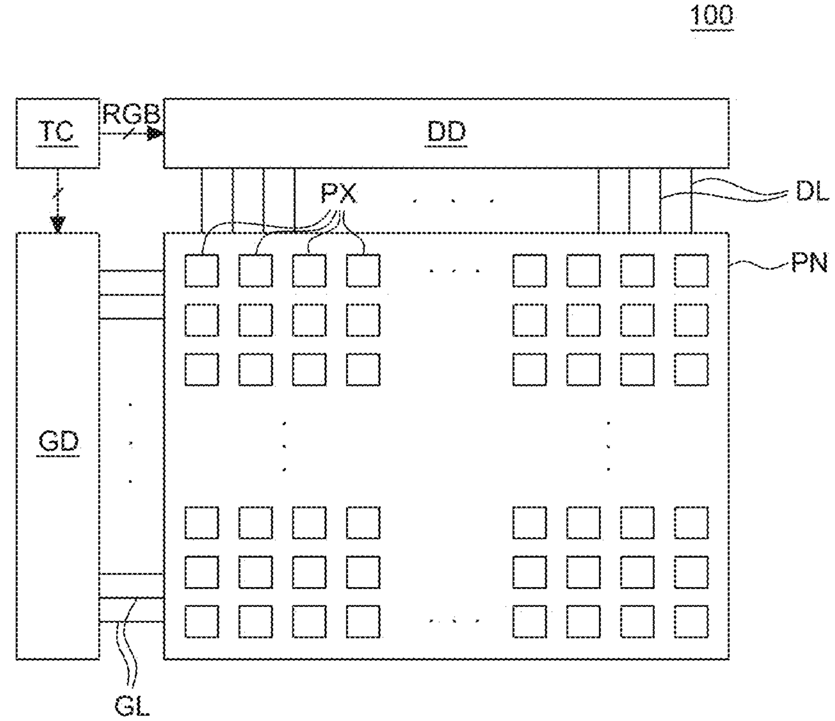
FIG. 1 is a block diagram of a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the disclosure. Further, in the following description of the present disclosure, a detailed explanation of known related technologies can be omitted to avoid unnecessarily obscuring the subject matter of the present disclosure. The terms such as “including,” “having,” and “consist of” used herein are generally intended to allow other components to be added unless the terms are used with the term “only”. Any references to singular can include plural unless expressly stated otherwise.

Components are interpreted to include an ordinary error range even if not expressly stated.

When the position relation between two parts is described using the terms such as “on”, “over”, “above”, “below”, and “next”, one or more parts can be positioned between the two parts unless the terms are used with the term “immediately” or “directly”.

When an element or layer is disposed “on” another element or layer, another layer or another element can be interposed directly on the other element or therebetween.

Although the terms “first”, “second”, and the like are used for describing various components, these components are not confined by these terms. These terms are merely used for distinguishing one component from the other components and may not define order or sequence. Therefore, a first component to be mentioned below can be a second component in a technical concept of the present disclosure.

Like reference numerals generally denote like elements throughout the disclosure.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other. Further, the term “can” encompasses al the meanings and coverages of the term “may.”

Hereinafter, a display device according to example embodiments of the present disclosure will be described in detail with reference to accompanying drawings. All the components of each display device or apparatus according to all embodiments of the present disclosure are operatively coupled and configured.

FIG. 1 is a block diagram of a display device according to an example embodiment of the present disclosure.

As a display device 100 according to an example embodiment of the present disclosure, an electroluminescent display device can be applied. As the electroluminescent display device, an organic light emitting diode display device, a quantum-dot light emitting diode display device, or an inorganic light emitting diode display device can be used.

Referring to FIG. 1, the display device 100 can include a display panel PN, a data driving circuit DD, a gate driving circuit GD, and a timing controller TC.

The display panel PN can generate an image to be provided to a user. For example, the display panel PN can generate and display the image to be provided to the user through pixels PX in which a plurality of sub-pixel circuits is disposed.

The data driving circuit DD, the gate driving circuit GD, and the timing controller TC can provide signals for the operation of each pixel PX through signal lines. The signal lines can include, for example, data lines DL and gate lines GL.

The data lines DL can include a plurality of lines that are disposed in a column direction and connected to the pixels PX disposed in the column direction, and the gate lines GL can include a plurality of lines that are disposed in a row direction and connected to the pixels PX disposed in the row direction.

In some cases, the display device 100 can further include a power supply unit. In this case, a signal for operating the pixel PX can be provided through a power line connecting the power supply unit and the display panel PN. According to the example embodiment, the power supply unit can provide power to the data driving circuit DD and the gate driving circuit GD. The data driving circuit DD and the gate driving circuit GD can be driven based on power provided from the power supply unit.

For example, the data driving circuit DD can apply a data signal to each pixel PX through the data lines DL, the gate driving circuit GD can apply a gate signal to each pixel PX through the gate lines GL, and the power supply unit can supply power voltage to each pixel PX through power voltage supply lines.

The timing controller TC can control the data driving circuit DD and the gate driving circuit GD. For example, the timing controller TC can rearrange digital video data input from the outside to match a resolution of the display panel PN and supply the rearranged digital video data to the data driving circuit DD.

The data driving circuit DD can convert the digital video data input from the timing controller TC into an analog data voltage based on a data control signal and supply the analog data voltage to the plurality of data lines DL.

The gate driving circuit GD can generate a scan signal and an emission signal (or emission control signal) based on a gate control signal. The gate driving circuit GD can include a scan driver and an emission signal driver. The scan driver can generate scan signals in a row sequential manner to drive at least one scan line connected to each pixel row and supply the generated scan signals to the scan lines. The emission signal driver can generate the emission signal in the row sequential manner to drive at least one emission signal line connected to each pixel row and supply the generated emission signal to the emission signal lines.

According to an example embodiment, the gate driving circuit GD can be disposed on the display panel PN using a gate-driver in panel (GIP) manner. For example, the gate driving circuit GD can be divided into plurality and disposed on at least two side surfaces of the display panel PN, respectively.

The display panel PN can include an active area and a non-active area surrounding the active area. For example, the non-active area can surround the active area entirely or in part.

The active area of the display panel PN can include a plurality of pixels PX disposed in the row and column directions. The pixel PX can be disposed in an area where a plurality of data lines and a plurality of gate lines intersect.

One pixel PX can include a plurality of sub-pixels that emits different colors. For example, the pixel PX can implement blue, red, and green colors using three sub-pixels. However, the pixel PX is not limited thereto, and in some cases, the pixel PX can further include sub-pixels to further implement a specific color (e.g., white).

In the pixel PX, an area implementing blue can be referred to as a blue sub-pixel, an area implementing red can be referred to as a red sub-pixel, and an area implementing green can be referred to as a green sub-pixel.

Each of the plurality of sub-pixels can include a first light emitting element and a second light emitting element, and can include a first lens that refracts light from the first light emitting element in a specific direction and a second lens that refracts light from the second light emitting element in a specific direction. Accordingly, the first lens and a second lens can limit viewing angles of each of the plurality of sub-pixels.

A detailed description of the first lens and the second lens will be described below with reference to FIGS. 4A and 4B.

The non-active area can be disposed along a circumference of the active area. Various components for driving a plurality of sub-pixels disposed in the pixel PX can be disposed in the non-active area. For example, at least a portion of the gate driving circuit GD can be disposed in the non-active area. The non-active area can be referred to as a bezel area.

Figure 2:
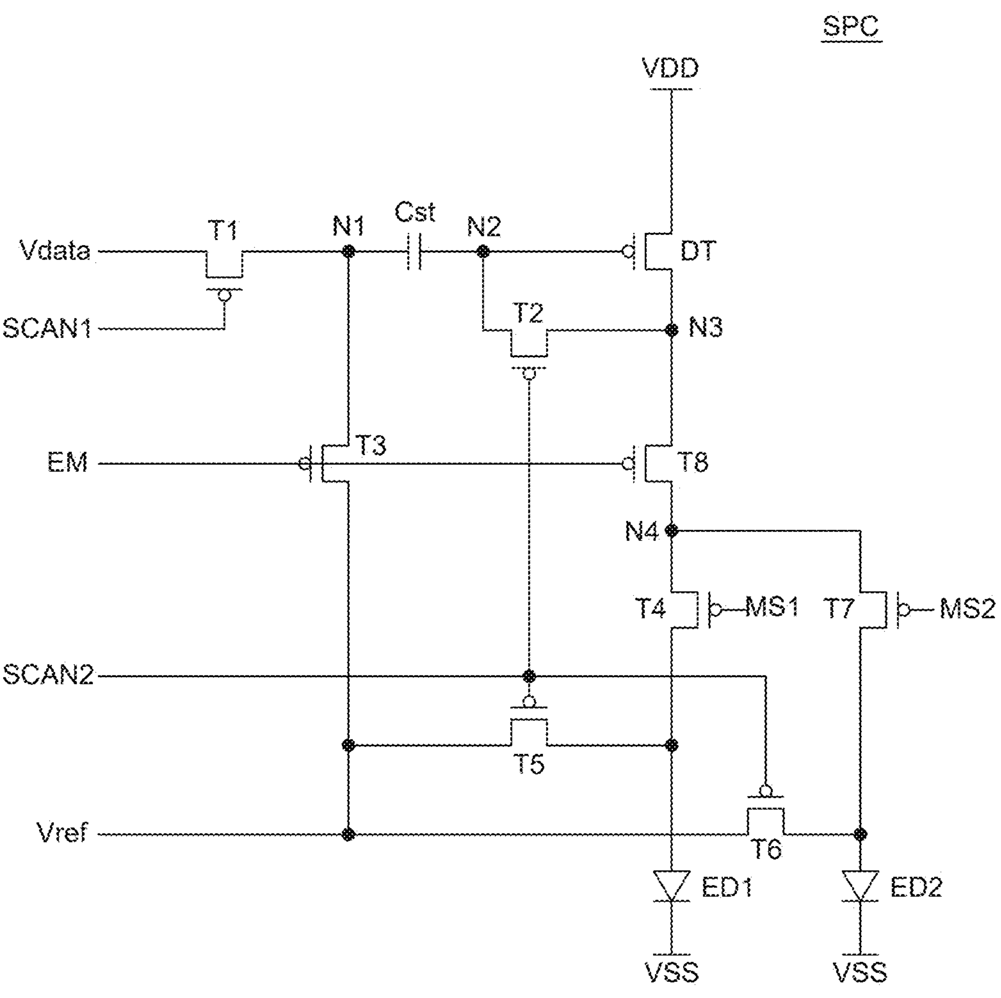
FIG. 2 is a circuit diagram of a sub-pixel of the display device according to the example embodiment of the present disclosure.

FIG. 2 is a circuit diagram of a sub-pixel of the display device according to the example embodiment of the present disclosure. The plurality of pixels PX can include a plurality of sub-pixels SP (see FIG. 6) each representing different colors, and a sub-pixel circuit SPC corresponding to each of the plurality of sub-pixels SP.

Referring to FIG. 2, each of the plurality of sub-pixels SP (see FIG. 6) includes a plurality of light emitting elements ED1 and ED2, and each of the plurality of sub-pixel circuits SPC includes a driving transistor DT, first to eighth transistors T1 to T8, and a storage capacitor Cst.

The plurality of transistors DT and T1 to T8 can include at least one of amorphous silicon, polycrystalline silicon, and oxide semiconductor such as IGZO. A first or second electrode of the transistor can be a source electrode or a drain electrode. For example, the first electrode can be the source electrode and the second electrode can be the drain electrode. As another example, the first electrode can be the drain electrode and the second electrode can be the source electrode.

At least some of the plurality of transistors included in the sub-pixel circuit SPC can be an n-type transistor or a p-type transistor. In the case of the p-type transistor, a low-level voltage of each driving signal refers to a voltage that turns on a TFT, and a high-level voltage of each driving signal can refer to a voltage that turns off the transistors.

Here, the low-level voltage can correspond to a preset voltage that is lower than the high level. For example, the low-level voltage can include a voltage that falls within the range of −8 V to −12 V. The high-level voltage can correspond to a preset voltage that is higher than the low-level voltage. For example, the high-level voltage can include a voltage that falls within the range of 12 V to 16 V. According to an example embodiment, the low-level voltage can be referred to as a first voltage, and the high-level voltage can be referred to as a second voltage. In this case, the first voltage can be lower than the second voltage.

The first electrode or second electrode of the transistor, which will be described below, can refer to the source electrode or the drain electrode. However, the terms first electrode and second electrode are only terms for distinguishing each electrode and do not limit what corresponds to each electrode. In addition, the first electrode for each electrode may not refer to the same electrode. For example, the first electrode of the first transistor T1 can refer to the source electrode of the first transistor T1, and the first electrode of the eighth transistor T8 can refer to the drain electrode of the eighth transistor T8.

The driving transistor DT can control a driving current applied to the plurality of light emitting elements according to a source-gate voltage Vsg. The driving transistor DT includes a source electrode connected to a high-potential driving voltage line to which a high-potential driving voltage VDD is supplied, a gate electrode connected to a second node N2, and a drain electrode connected to a third node N3.

The first transistor T1 can apply a data voltage Vdata from the data line DL to the first node N1. The first transistor T1 includes a source electrode connected to the data line, the drain electrode connected to the first node N1, and a gate electrode connected to a first scan signal line to which a first scan signal SCAN1 is applied. The first transistor T1 can be turned on or off by the first scan signal SCAN1. Accordingly, the first transistor T1 can apply the data voltage Vdata from the data line DL to the first node N1 in response to the low-level first scan signal SCAN1 which is the turn-on level.

The second transistor T2 can diode-connect the gate electrode and drain electrode of the driving transistor DT. The second transistor T2 includes a drain electrode connected to the second node N2, a source electrode connected to the third node N3, and a gate electrode connected to a second scan signal line to which a second scan signal SCAN2 is applied. The second transistor T2 can be turned on or off by the second scan signal SCAN2. Accordingly, the second transistor T2 can diode-connect the gate electrode and drain electrode of the driving transistor DT in response to the low-level second scan signal SCAN2 which is the turn-on level.

The third transistor T3 can apply a reference voltage Vref to the first node N1. The third transistor T3 includes a source electrode connected to a reference line transmitting the reference voltage Vref, a drain electrode connected to the first node N1, and a gate electrode connected to the emission signal line. The third transistor T3 can be turned on or off by an emission signal EM. Accordingly, the third transistor T3 can transmit the reference voltage Vref to the first node N1 in response to the low-level emission signal EM which is the turn-on level.

When driven in a wide-view mode, which is a first mode, the fourth transistor T4 can form a current path between the driving transistor DT and the first light emitting element ED1. The fourth transistor T4 includes a source electrode connected to a fourth node N4, a drain electrode connected to an anode electrode of the first light emitting element ED1, and a gate electrode connected to a first mode control line to which a first mode signal MS1 is applied. The fourth transistor T4 can be turned on or off by the first mode signal MS1. Accordingly, the fourth transistor T4 forms a current path between the fourth node N4, which is a source electrode of the fourth transistor T4, and the first light emitting element ED1 in response to the low-level first mode signal MS1 which is the turn-on level. For example, the fourth transistor T4 forms a current path between the driving transistor DT and the first light emitting element ED1 in response to the low-level first mode signal MS1. Accordingly, the fourth transistor T4 can also be referred to as a first light emission control transistor that controls the emission of the first light emitting element ED1.

Here, the first mode signal MS1 is provided by a first level shift LS1, which will be described below, and can control the driving (or emission) of the first light emitting element ED1 on which the first lens is disposed.

The fifth transistor T5 can apply the reference voltage Vref to an anode electrode of the first light emitting element ED1. The fifth transistor T5 includes a source electrode connected to the reference line transmitting the reference voltage Vref, a drain electrode connected to the anode electrode of the first light emitting element ED1, and a gate electrode connected to the second scan signal line to which the second scan signal SCAN2 is applied. The fifth transistor T5 can be turned on or off by the second scan signal SCAN2. Accordingly, the fifth transistor T5 can apply the reference voltage Vref to the anode electrode of the first light emitting element ED1 in response to the low-level second scan signal SCAN2 which is the turn-on level.

The sixth transistor T6 can apply the reference voltage Vref to an anode electrode of the second light emitting element ED2. The sixth transistor T6 includes a source electrode connected to the reference line transmitting the reference voltage Vref, a drain electrode connected to the anode electrode of the second light emitting element ED2, and a gate electrode connected to the second scan signal line to which the second scan signal SCAN2 is applied. The sixth transistor T6 can be turned on or off by the second scan signal SCAN2. Accordingly, the sixth transistor T6 can apply the reference voltage Vref to the anode electrode of the second light emitting element ED2 in response to the low-level second scan signal SCAN2 which is the turn-on level.

When driven in a narrow-view mode, which is a second mode, the seventh transistor T7 can form a current path between the driving transistor DT and the second light emitting element ED2. The seventh transistor T7 includes a source electrode connected to the fourth node N4, a drain electrode connected to an anode electrode of the second light emitting element ED2, and a gate electrode connected to a second mode control line to which a second mode signal MS2 is applied. The seventh transistor T7 can be turned on or off by the second mode signal MS2. Accordingly, the seventh transistor T7 forms a current path between the fourth node N4, which is a source electrode of the seventh transistor T7, and the second light emitting element ED2 in response to the low-level second mode signal MS2 which is the turn-on level. For example, the seventh transistor T7 forms a current path between the driving transistor DT and the second light emitting element ED2 in response to the low-level second mode signal MS2. Accordingly, the seventh transistor T7 can also be referred to as a second light emission control transistor that controls the emission of the second light emitting element ED2.

Here, the second mode signal MS2 is provided by a second level shift LS2, which will be described below, and can control the driving (or emission) of the second light emitting element ED2 on which the second lens is disposed.

The eighth transistor T8 can apply the driving current of the driving transistor DT to the fourth node N4. The eighth transistor T8 includes a source electrode connected to the third node N3, a drain electrode connected to the fourth node N4, and a gate electrode connected to the emission signal line that transmits the emission signal EM. The eighth transistor T8 can be turned on or off by the emission signal EM. Accordingly, the eighth transistor T8 can transmit the driving current to the fourth node N4 in response to the low-level emission signal EM which is the turn-on level.

The storage capacitor Cst includes a first electrode connected to the first node N1 and a second electrode connected to the second node N2. For example, one electrode of the storage capacitor Cst is connected to the gate electrode of the driving transistor DT, and the other electrode of the storage capacitor Cst is connected to the first transistor T1. The storage capacitor Cst can store a certain voltage and keep the voltage of the gate electrode of the driving transistor DT constant while the light emitting element emits light.

The first light emitting element ED1 can be connected to the fourth transistor T4 which is turned on or off by the first mode signal MS1. The second light emitting element ED2 can be connected to the seventh transistor T7 which is turned on or off by the second mode signal MS2.

In this case, the first light emitting element ED1 or the second light emitting element ED2 can be connected to other components of the sub-pixel circuit SPC, for example, a driving transistor DT, according to the mode. The mode can be specified by user input or determined when pre-specified conditions are satisfied. For example, when a pre-specified first condition is satisfied, the first light emitting element ED1 can emit light based on the fact that the first mode signal MS1 is supplied. When a pre-specified second condition is satisfied, the second light emitting element ED2 can emit light based on the fact that the second mode signal MS2 is supplied. The first condition can include the pre-specified condition for driving in the first mode. The second condition can include the pre-specified condition for driving in the second mode.

When the first mode signal MS1 is input as a low value, the sub-pixel circuit can operate in the first mode. When the second mode signal MS2 is input as a low value, the sub-pixel circuit can operate in the second mode. In this case, the first mode can be a wide-view mode, and the second mode can be a narrow-view mode.

Specifically, the first light emitting element ED1 emits light in the wide-view mode which is the first mode. As illustrated in FIG. 4A, a semi-cylindrical first lens 161 is disposed on the first light emitting element ED1, so it is possible to implement the wide-view mode. The first light emitting element ED1 includes an anode electrode connected to the fourth transistor T4 and a cathode electrode connected to a low-potential power line to which a low-potential power source VSS is applied. The first light emitting element ED1 receives the driving current of the driving transistor DT through the turned-on fourth transistor T4 when being in the wide-view mode. Accordingly, when driven in the wide-view mode, the first light emitting element ED1 can receive driving current to emit light.

The second light emitting element ED2 emits light in the narrow-view mode. As illustrated in FIG. 4B, a hemispherical second lens 162 is disposed on the second light emitting element ED2, so the narrow-view mode can be implemented. The second light emitting element ED2 includes an anode electrode connected to the seventh transistor T7 and a cathode electrode connected to the low-potential power line. The second light emitting element ED2 receives the driving current of the driving transistor DT through the turned-on seventh transistor T7 when being in the narrow-view mode. Accordingly, when driven in the narrow-view mode, the second light emitting element ED2 can receive the driving current to emit light.

Figure 3A:
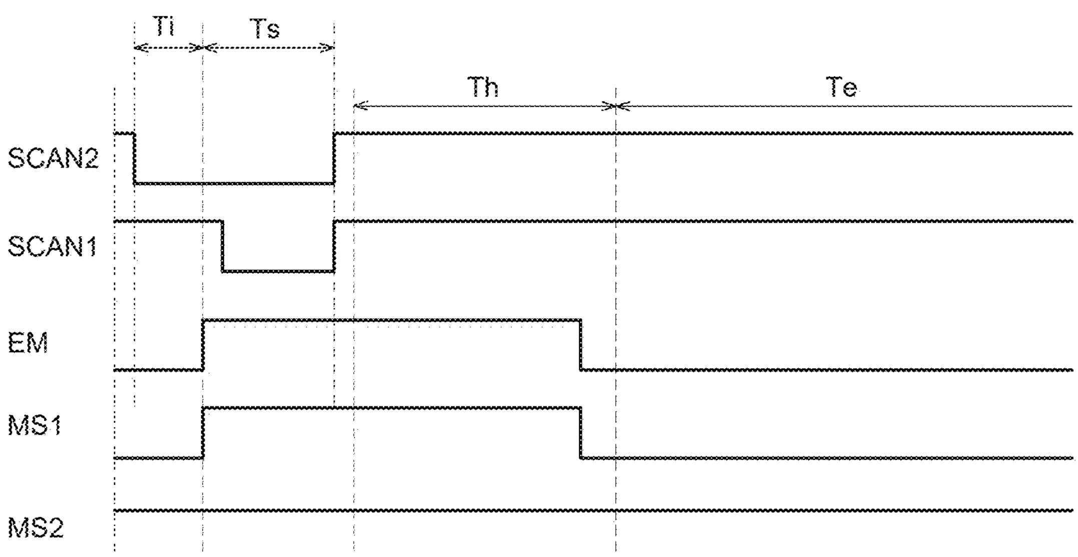
FIGS. 3A and 3B are waveform diagrams for describing a sub-pixel circuit of the display device according to the example embodiment of the present disclosure.
Figure 3B:
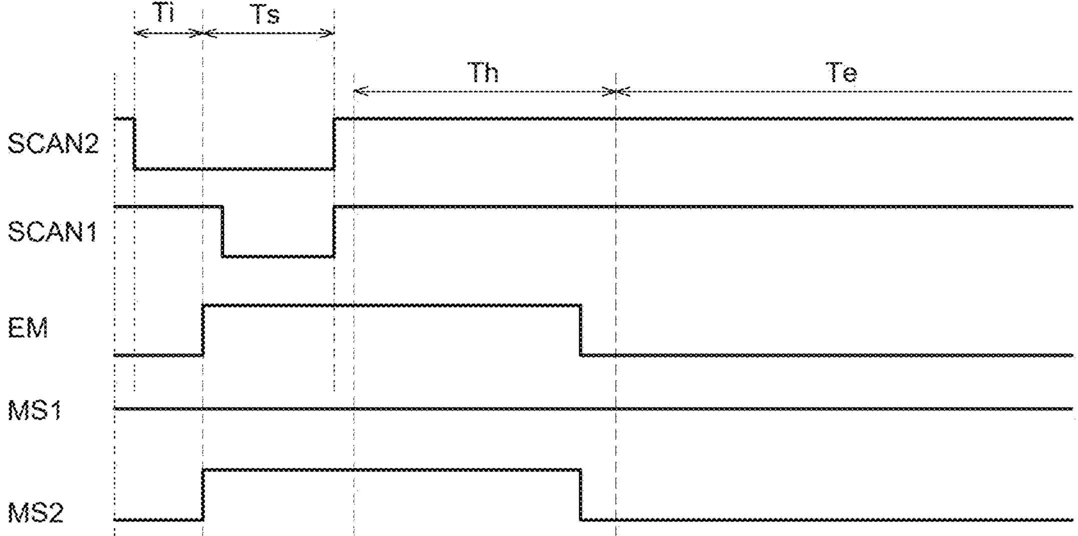

FIGS. 3A and 3B are waveform diagrams for describing a sub-pixel circuit of the display device according to the example embodiment of the present disclosure. Specifically, FIG. 3A is a waveform diagram for describing a sub-pixel circuit for implementing the wide-view mode which is the first mode, and FIG. 3B is a waveform diagram for describing a sub-pixel circuit for implementing the narrow-view mode which is the second mode.

Referring to FIGS. 2 to 3B together, in the wide-view mode, only the first light emitting element ED1 can emit light, and in the narrow-view mode, only the second light emitting element ED2 can emit light. In the wide-view mode, the second mode signal MS2, which controls the emission of the second light emitting element ED2, can be output only at a high level, which is the turn-off level, so that only the first light emitting element ED1 emits light, and in the narrow-view mode, the first mode signal MS1, which controls the emission of the first light emitting element ED1, can be output only at a high level, which is the turn-off level, so that only the second light emitting element ED2 emits light.

Specifically, looking at the wide-view mode with reference to FIGS. 2 and 3A, the low-level second scan signal SCAN2, the low-level first mode signal MS1, and the low-level emission signal EM are output in an initial period Ti. The second transistor T2, the fifth transistor T5, and the sixth transistor T6 can be turned on by the low-level second scan signal SCAN2, the fourth transistor T4 can be turned on by the low-level first mode signal MS1, and the third transistor T3 and the eighth transistor T8 can be turned on by the low-level emission signal EM.

The first node N1 can be initialized to the reference voltage Vref through the turned-on third transistor T3. The voltage of the anode electrode of the first light emitting element ED1 can be initialized to the reference voltage Vref through the turned-on fifth transistor T5, and the voltage of the anode electrode of the second light emitting element ED2 can be initialized to the reference voltage Vref through the turned-on sixth transistor T6. The driving transistor DT is diode-connected through the turned-on second transistor T2, and the gate electrode and drain electrode of the driving transistor DT are short-circuited, so the driving transistor DT operates like a diode. The reference voltage Vref transmitted to the anode electrode side of the first light emitting element ED1 through the turned-on fifth transistor T5 is transmitted to the third node N3 and the second node N2 through the turned-on fourth transistor T4 and eighth transistor T8, so the fourth node N4, the third node N3, and the second node N2 can also be initialized to the reference voltage Vref.

Next, during a sampling period Ts, the low-level first scan signal SCAN1 and the low-level second scan signal SCAN2 can be output, and the first mode signal MS1 can be output at a high level. The high-level emission signal EM is output, so the third transistor T3 can be turned off, and at the same time, the first transistor T1 is turned on by the low-level first scan signal SCAN1, so the data voltage Vdata can be transmitted to the first node N1. The driving transistor DT is diode-connected by the turned-on second transistor T2, and a difference voltage between the high-potential power voltage and the threshold voltage can be sampled and supplied to the second node N2.

During a holding period Th, the first scan signal SCAN1 and the second scan signal SCAN2 are output at a high level, and the first transistor T1, the second transistor T2, the fifth transistor T5, and the sixth transistor T6 can all be turned off. However, even if the first transistor T1 is turned off, the data voltage Vdata input in a previous sampling period Ts can be maintained by the storage capacitor Cst.

Finally, during an emission period Te, the low-level first mode signal MS1 and the emission signal EM are output, and the high-level second mode signal MS2 is output. The reference voltage Vref is applied to the first node N1 through the third transistor T3 turned on by the low-level emission signal EM and the voltage of the first node N1 can be the difference voltage between the reference voltage Vref and the data voltage Vdata. This voltage change can also be reflected in the second node N2. The gate-source voltage Vgs of the driving transistor DT can be set to a value Vdata−Vref+Vth obtained by subtracting the reference voltage Vref from the data voltage Vdata and adding it to the threshold voltage Vth to control the driving current.

The driving current is supplied from the driving transistor DT to the first light emitting element ED1 through the turned-on fourth transistor T4 and eighth transistor T8, so the first light emitting element ED1 can emit light. However, the second mode signal MS2 is output at a high level, and thus, the seventh transistor T7 is turned off, so the driving current is not transmitted from the driving transistor DT to the second light emitting element ED2. Accordingly, in the wide-view mode, the driving current is applied only to the first light emitting element ED1, so only the first light emitting element ED1 can emit light.

Looking at the narrow-view mode with reference to FIGS. 2 and 3B, the sub-pixel circuit SPC can be driven in substantially the same way as the wide-view mode except that the first mode signal MS1 and the second mode signal MS2 are output in reverse. For example, the first mode signal MS1 can be output only at a high level, which is the turn-off level, and the second mode signal MS2 can be output at a low level, which is the turn-on level, during the emission period Te when the second light emitting element ED2 emits light.

Specifically, during the initial period Ti, the first scan signal SCAN1 is output at a high level, and the second scan signal SCAN2 is output at a low level. The first mode signal MS1 is output at a high level, and the second mode signal MS2 and the emission signal EM are output at a low level. Accordingly, the second transistor T2, the fifth transistor T5, and the sixth transistor T6 can be turned on by the second scan signal SCAN2, the seventh transistor T7 can be turned on by the second mode signal MS2, and the third transistor T3 and the eighth transistor T8 can be turned on by the emission signal EM.

The first node N1 can be initialized to the reference voltage Vref through the third transistor T3 turned on by the emission signal EM, and the anode electrodes of the first light emitting element ED1 and the second light emitting element ED2 can be initialized to the reference voltage Vref by each of the fifth transistor T5 and the sixth transistor T6 turned on by the second scan signal SCAN2. The driving transistor DT is diode-connected through the turned-on second transistor T2 and operates like a diode. Finally, the reference voltage Vref transmitted to the anode electrode side of the second light emitting element ED2 through the turned-on sixth transistor T6 is transmitted to the fourth node N4, the third node N3, and the second node N2 through the turned-on seventh transistor T7, so the third node N3 and the second node N2 can also be initialized to the reference voltage Vref.

Next, during the sampling period Ts, the low-level first scan signal SCAN1 and the low-level second scan signal SCAN2 can be output, and the second mode signal MS2 and the emission signal EM can be output at a high level from a low level. The high-level emission signal EM is output, so the third transistor T3 can be turned off, and the first transistor T1 is turned on by the low-level first scan signal SCAN1, so the data voltage Vdata can be transmitted to the first node N1. The driving transistor DT is diode-connected by the turned-on second transistor T2, and a difference voltage between the high-potential power voltage and the threshold voltage can be sampled and supplied to the second node N2.

During the holding period Th, the first scan signal SCAN1 and the second scan signal SCAN2 are output at a high level, and the first transistor T1, the second transistor T2, the fifth transistor T5, and the sixth transistor T6 can all be turned off. However, even if the first transistor T1 is turned off, the data voltage Vdata input in the previous sampling period Ts can be maintained by the storage capacitor Cst.

Finally, during the emission period Te, the low-level second mode signal MS2 and the emission signal EM are output, and the high-level first mode signal MS1 is output. The reference voltage Vref is applied to the first node N1 through the third transistor T3 turned on by the low-level emission signal EM and the voltage of the first node N1 can be the difference voltage between the reference voltage Vref and the data voltage Vdata. This voltage change can also be reflected in the second node N2. The gate-source voltage Vgs of the driving transistor DT can be set to the value Vdata−Vref+Vth obtained by subtracting the reference voltage Vref from the data voltage Vdata and adding it to the threshold voltage Vth to control the driving current.

The driving current is supplied from the driving transistor DT to the second light emitting element ED2 through the turned-on seventh transistor T7, so the second light emitting element ED2 can emit light. However, the first mode signal MS1 is output at a high level, and thus, the fourth transistor T4 is turned off, so the driving current is not transmitted from the driving transistor DT to the first light emitting element ED1. Accordingly, in the narrow-view mode, the driving current is applied only to the second light emitting element ED2, so only the second light emitting element ED2 can emit light.

Figure 4A:
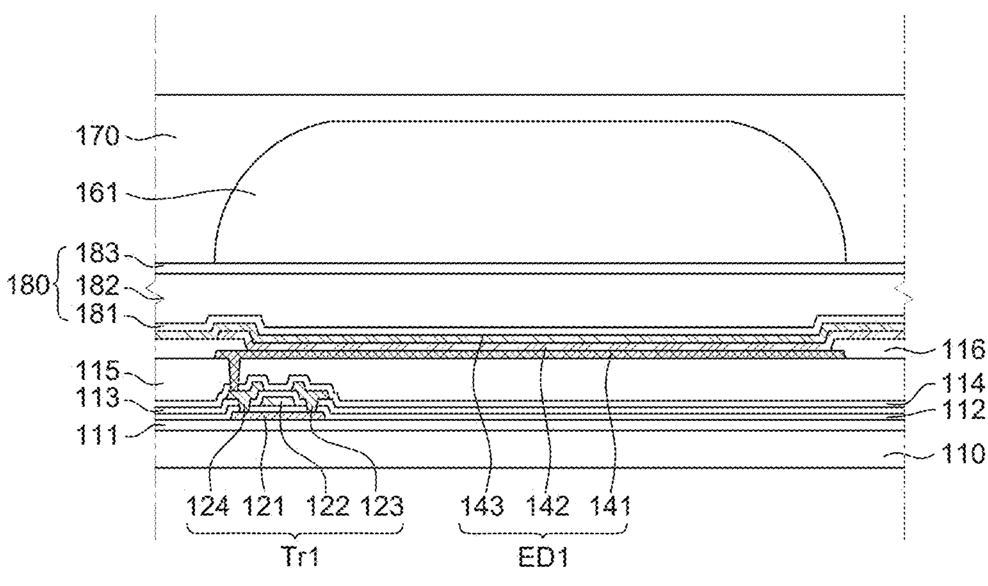
FIGS. 4A and 4B are cross-sectional views of the display device according to the example embodiment of the present disclosure.
Figure 4B:
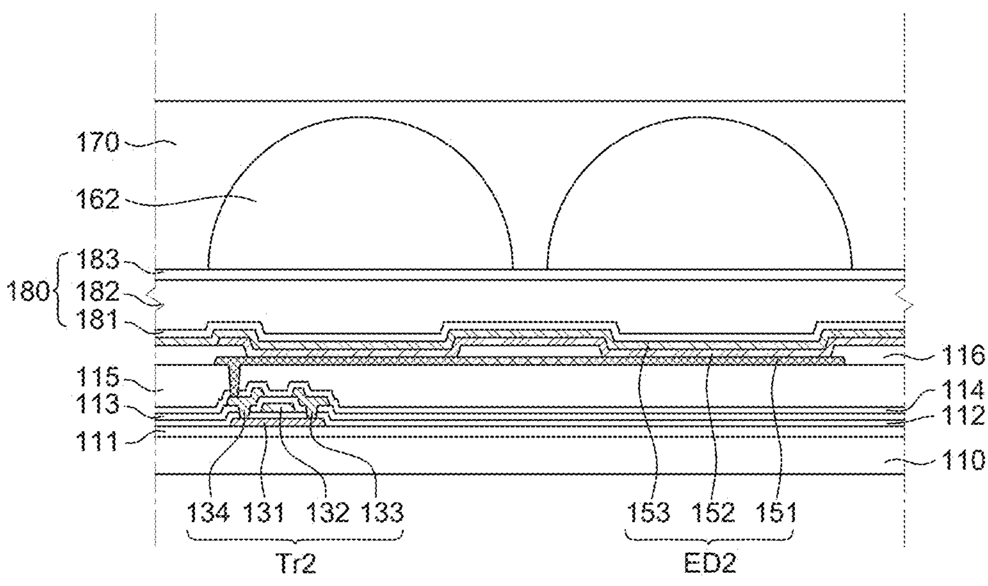

FIGS. 4A and 4B are cross-sectional views of the display device according to the example embodiment of the present disclosure. Specifically, FIG. 4A illustrates the sub-pixel in which the first lens 161 is disposed, and FIG. 4B illustrates the sub-pixel in which the second lens 162 is disposed.

Referring to FIGS. 4A and 4B, the display device 100 according to an example embodiment of the present disclosure includes a substrate 110, a buffer film 111, a gate insulating film 112, an interlayer insulating film 113, a lower protection film 114, an overcoat layer 115, the first transistor Tr1, the second transistor Tr2, the first light emitting element ED1, the second light emitting element ED2, the first lens 161, the second lens 162, a lens protection film 170, and an encapsulation member 180.

The substrate 110 can include an insulating material. The substrate 110 can include a transparent material. For example, the substrate 110 can include glass or plastic.

The buffer film 111 can be disposed on the substrate 110. The buffer film 111 can include an insulating material. For example, the buffer film 111 can include an inorganic insulating material such as silicon oxide (SiOx) and silicon nitride (SiNx). The buffer film 111 can have a multi-layer structure. For example, the buffer film 111 can have a stacked structure of a film formed of silicon nitride (SiNx) and a film formed of silicon oxide (SiOx).

The buffer film 111 can be located between the substrate 110 and a driving part of each pixel PX. The buffer film 111 can prevent contamination by the substrate 110 during the process of forming the driving part. For example, a top surface of the substrate 110 facing the driving part of each pixel PX can be covered with the buffer film 111. The driving part of each pixel PX can be located on the buffer film 111.

The gate insulating film 112 can be disposed on the buffer film 111. The gate insulating film 112 can include an insulating material. For example, the gate insulating film 112 can include an inorganic insulating material such as silicon oxide (SiOx) and silicon nitride (SiNx). The gate insulating film 112 can include a material with a high dielectric constant. For example, the gate insulating film 112 can include a high-K material such as hafnium oxide (HfO). The gate insulating film 112 can have a multi-layer structure.

The gate insulating film 112 can extend between the semiconductor layers 121 and 131 and the gate electrodes 122 and 132 of transistors Tr1 and Tr2. For example, the gate electrodes of the driving transistor DT and a switching transistor ST can be insulated from the semiconductor layer of the driving transistor DT and the switching transistor ST by the gate insulating film 112. The gate insulating film 112 can cover the semiconductor layer of each pixel PX. The gate electrodes of the driving transistor DT and the switching transistor ST can be located on the gate insulating film 112.

The interlayer insulating film 113 can be disposed on the gate insulating film 112. The interlayer insulating film 113 can include an insulating material. For example, the interlayer insulating film 113 can include an inorganic insulating material such as silicon oxide (SiOx) and silicon nitride (SiNx). The interlayer insulating film 113 can extend between the gate electrodes and the source electrodes and between the gate electrodes and the drain electrodes of each of the driving transistor DT and the switching transistor. For example, the source electrodes and drain electrodes of each of the driving transistor DT and the switching transistor can be insulated from the gate electrode by the interlayer insulating film 113. The interlayer insulating film 113 can cover the gate electrodes of each of the driving transistor DT and the switching transistor. The source electrodes and drain electrodes of each pixel PX can be located on the interlayer insulating film 113. The gate insulating film 112 and the interlayer insulating film 113 can expose source regions and drain regions of each semiconductor pattern located within each pixel PX.

The lower protection film 114 can be disposed on the interlayer insulating film 113. The lower protection film 114 can include an insulating material. For example, the lower protection film 114 can include an inorganic insulating material such as silicon oxide (SiOx) and silicon nitride (SiNx). The lower protection film 114 can prevent damage to the driving part due to external moisture and impact. The lower protection film 114 can extend along the surfaces of the driving transistor DT and the switching transistor ST facing the substrate 110. The lower protection film 114 can contact the interlayer insulating film 113 outside the driving part located within each pixel PX.

The overcoat layer 115 can be disposed on the lower protection film 114. The overcoat layer 115 can include an insulating material. The overcoat layer 115 can include a material different from that of the lower protection film 114. For example, the overcoat layer 115 can include an organic insulating material. The overcoat layer 115 can remove steps caused by the driving part of each pixel PX. For example, the top surface of the overcoat layer 115 facing a device substrate 110 can be a flat surface.

The first transistor Tr1 and the second transistor Tr2 can be disposed on the substrate 110. The first transistor Tr1 can be electrically connected between the drain electrode of the driving transistor DT and the first lower electrode 141 of the first light emitting element ED1. The second transistor Tr2 can be electrically connected between the drain electrode of the driving transistor DT and the second lower electrode 151 of the second light emitting element ED2.

The first transistor Tr1 can include a first semiconductor layer 121, a first gate electrode 122, a first source electrode 123, and a first drain electrode 124. The first transistor Tr1 can have the same structure as the switching transistor and driving transistor DT. For example, the first semiconductor layer 121 can be located between the buffer film 111 and the gate insulating film 112, and the first gate electrode 122 can be located between the gate insulating film 112 and the interlayer insulating film 113. The first source electrode 123 and the first drain electrode 124 can be located between the interlayer insulating film 113 and the lower protection film 114. The first gate electrode 122 can overlap a channel region of the first semiconductor layer 121. The first source electrode 123 can be electrically connected to a source region of the first semiconductor layer 121. The first drain electrode 124 can be electrically connected to a drain region of the first semiconductor layer 121.

The second transistor Tr2 can include a second semiconductor layer 131, a second gate electrode 132, a second source electrode 133, and a second drain electrode 134. For example, the second semiconductor layer 131 can be located on the same layer as the first semiconductor layer 121, the second gate electrode 132 can be located on the same layer as the first gate electrode 122, and the second source electrode 133 and the second drain electrode 134 can be located on the same layer as the first source electrode 123 and the first drain electrode 124.

The first light emitting element ED1 and the second light emitting element ED2 of each pixel PX can be disposed on the overcoat layer 115 of the corresponding pixel PX.

The first light emitting element ED1 can emit light representing a specific color. For example, the first light emitting element ED1 can include a first lower electrode 141, a first light emitting layer 142, and a first upper electrode 143 sequentially stacked on the substrate 110.

The first lower electrode 141 can include a conductive material. The first lower electrode 141 can include a material with high reflectivity. For example, the first lower electrode 141 can include metal such as aluminum (Al) and silver (Ag). The first lower electrode 141 can have a multi-layer structure. For example, the first lower electrode 141 can have a structure in which a reflective electrode formed of metal is located between transparent electrodes formed of transparent conductive materials such as ITO and IZO. The first lower electrode 141 can be electrically connected to a first drain electrode 124 (or first source electrode 123) of the first transistor Tr1 through a contact hole penetrating through the lower protection film 114 and the overcoat layer 115.

The first light emitting layer 142 can generate light with a luminance corresponding to a voltage difference between the first lower electrode 141 and the first upper electrode 143. For example, the first light emitting layer 142 can include an emission material layer (EML) including an emission material. The emission material can include organic materials, inorganic materials, or hybrid materials.

The first light emitting layer 142 can have a multi-layer structure. For example, the first light emitting layer 142 can further include at least one of a hole injection layer (HIL), a hole transport layer (HTL), an electron transport layer (ETL), and an electron injection layer (EIL).

The first upper electrode 143 can include a conductive material. The first upper electrode 143 can include a material different from that of the first lower electrode 141. A transmittance of the first upper electrode 143 can be higher than that of the first lower electrode 141. For example, the first upper electrode 143 can be a transparent electrode formed of a transparent conductive material such as ITO and IZO. Accordingly, in the display device according to an example embodiment of the present disclosure, the light generated by the first light emitting layer 142 can be emitted through the first upper electrode 143.

The second light emitting element ED2 can have the same structure as the first light emitting element ED1. For example, the second light emitting element ED2 can include a second lower electrode 151, a second light emitting layer 152, and a second upper electrode 153 sequentially stacked on the substrate 110.

The second lower electrode 151 can correspond to the first lower electrode 141, the second light emitting layer 152 can correspond to the first light emitting layer 142, and the second upper electrode 153 can correspond to the first upper electrode 143. For example, the second lower electrode 151 can be formed for the second light emitting element ED2 in the same structure as the first lower electrode 141, which is the same for the second light emitting layer 152 and the second upper electrode 153. For example, the first light emitting element ED1 and the second light emitting element ED2 can be formed to have the same structure. However, the present disclosure is not limited thereto, and in some cases, at least some configurations of the first light emitting element ED1 and the second light emitting element ED2 can be formed differently.

In an example embodiment, the second light emitting layer 152 can be spaced apart from the first light emitting layer 142. Accordingly, in the display device according to an example embodiment of the present disclosure, the emission due to leakage current can be prevented.

According to an example embodiment of the present disclosure, in the display device, light can be generated only from one of the first light emitting layer 142 and the second light emitting layer 152 according to the user selection or the pre-specified conditions.

The second lower electrode 151 of each pixel PX can be spaced apart from the first lower electrode 141 of the corresponding pixel PX. For example, a bank insulating film 116 can be disposed between the first lower electrode 141 and the second lower electrode 151 of each pixel PX. The bank insulating film 116 can include an insulating material. For example, the bank insulating film 116 can include an organic insulating material. The bank insulating film 116 can include a material different from that of the overcoat layer 115.

The second lower electrode 151 of each pixel PX can be insulated from the first lower electrode 141 of the corresponding pixel PX by the bank insulating film 116. For example, the bank insulating film 116 can cover an edge of the first lower electrode 141 and an edge of the second lower electrode 151 located within each pixel PX. Accordingly, in the display device, an image from the first lens area of each pixel PX where the first light emitting element ED1 is located or an image from the second lens area of each pixel PX where the second light emitting element ED2 is located can be provided to a user.

The first light emitting layer 142 and the first upper electrode 143 of the first light emitting element ED1 located within each pixel PX can be stacked on a partial area of the corresponding first lower electrode 141 exposed by the bank insulating film 116. The second light emitting layer 152 and the second upper electrode 153 of the second light emitting element ED2 located within each pixel PX can be stacked on a partial area of the corresponding second lower electrode 151 exposed by the bank insulating film 116. For example, the bank insulating film 116 can distinguish within each pixel PX between a first emission area where light is emitted from the first light emitting element ED1 and a second emission area where light is emitted from the second light emitting element ED2. The size of the second emission area divided within each pixel PX can be smaller than that of the first emission area.

The second upper electrode 153 of each pixel PX can be electrically connected to the first upper electrode 143 of the corresponding pixel PX. For example, the voltage applied to the second upper electrode 153 of the second light emitting element ED2 located within each pixel PX can be the same as the voltage applied to the first upper electrode 143 of the first light emitting element ED1 located within the corresponding pixel PX. The second upper electrode 153 of each pixel PX can include the same material as the first upper electrode 143 of the corresponding pixel PX. For example, the second upper electrode 153 of each pixel PX can be formed simultaneously with the first upper electrode 143 of the corresponding pixel PX. The second upper electrode 153 of each pixel PX can extend onto the bank insulating film 116 and directly contact the first upper electrode 143 of the corresponding pixel PX. The luminance of the first lens area and the luminance of the second lens area located within each pixel PX can be controlled by the driving current generated in the corresponding pixel PX.

An encapsulation member 180 can be located on the first light emitting element ED1 and the second light emitting element ED2 of each pixel PX. The encapsulation member 180 can prevent damage to the light emitting elements ED1 and ED2 due to external moisture and impact. The encapsulation member 180 can have a multi-layer structure. For example, the encapsulation member 180 can include a first encapsulation layer 181, a second encapsulation layer 182, and a third encapsulation layer 183 that are sequentially stacked, but is not limited thereto. The first encapsulation layer 181, the second encapsulation layer 182, and the third encapsulation layer 183 can include an insulating material. The second encapsulation layer 182 can include a material different from the first encapsulation layer 181 and the third encapsulation layer 183. For example, the first encapsulation layer 181 and the third encapsulation layer 183 are inorganic encapsulation layers including an inorganic insulating material, and the second encapsulation layer 182 can include an organic encapsulation layer including an organic insulating material. Accordingly, the light emitting elements ED1 and ED2 of the display device can be more effectively prevented from being damaged by external moisture and impact.

The first lens 161 and the second lens 162 can be located on the encapsulation member 180 of each pixel PX. Meanwhile, the term "lens" used in the present disclosure is used for convenience of description, and can be defined as an optical member instead of the lens, as longs as they can function to refract light.

The first lens 161 can be disposed on the first light emitting element ED1. The light generated by the first light emitting element ED1 of each pixel PX can be emitted through the first lens 161 of the corresponding pixel PX. The first lens 161 can have a shape in which light in at least one direction is not limited. For example, the planar shape of the first lens 161 located within each pixel PX can have a bar shape extending in the first direction.

In this case, the travel direction of light emitted from the first lens area of the pixel PX may not be limited to the first direction. For example, the content (or images) provided through the first lens area of the pixel PX can be shared with people around a user who are adjacent to the user in the first direction. In the case of providing content through the first lens area, a mode that provides content in a first viewing angle range that is wider than a second viewing angle range provided by the second lens area can be referred to as the wide-view mode that is the first mode.

The second lens 162 can be disposed on the second light emitting element ED2. The light generated by the second light emitting element ED2 of each pixel PX can be emitted through the second lens 162 of the corresponding pixel PX. The second lens 162 can limit the travel direction of passing light to the first direction and/or the second direction. For example, the planar shape of the second lens 162 located within the pixel PX can have a circular shape. In this case, the travel direction of light emitted from the second lens area of the pixel PX can be limited to the first direction and the second direction. For example, content provided by the second lens area of the pixel PX may not be shared with people around the user. In the case of providing content through the second lens area, a mode that provides content in the second viewing angle range that is narrower than the first viewing angle range provided by the first lens area can be referred to as the narrow-view mode which is the second mode.

The first emission area of each pixel PX can have a shape corresponding to the first lens 161 of the corresponding pixel PX. For example, the planar shape of the first emission area of each pixel PX can have a bar shape extending in the first direction. The first lens 161 can have a size larger than the first emission area of the corresponding pixel PX. Accordingly, the efficiency of light emitted from the first emission area of the pixel PX can be improved.

The second emission area of each pixel PX can have a shape corresponding to the second lens 162 of the corresponding pixel PX. For example, the planar shape of the second emission area of each pixel PX can have a circular shape. The second lens 162 can have a size larger than the second emission area of the corresponding pixel PX. Accordingly, the efficiency of light emitted from the second emission area of the pixel PX can be improved.

In an example embodiment, a lens protection film 170 can be located on the first lens 161 and the second lens 162 of the pixel PX. The lens protection film 170 can include an insulating material. For example, the lens protection film 170 can include an organic insulating material. The refractive index of the lens protection film 170 can be smaller than the refractive indexes of the first lens 161 and the second lens 162 located within each pixel PX. Accordingly, in the display device according to the example embodiment of the present disclosure, light passing through the first lens 161 and the second lens 162 of each pixel PX may not be reflected toward the substrate 110 due to a difference in refractive index from the lens protection film 170.

Figure 5:
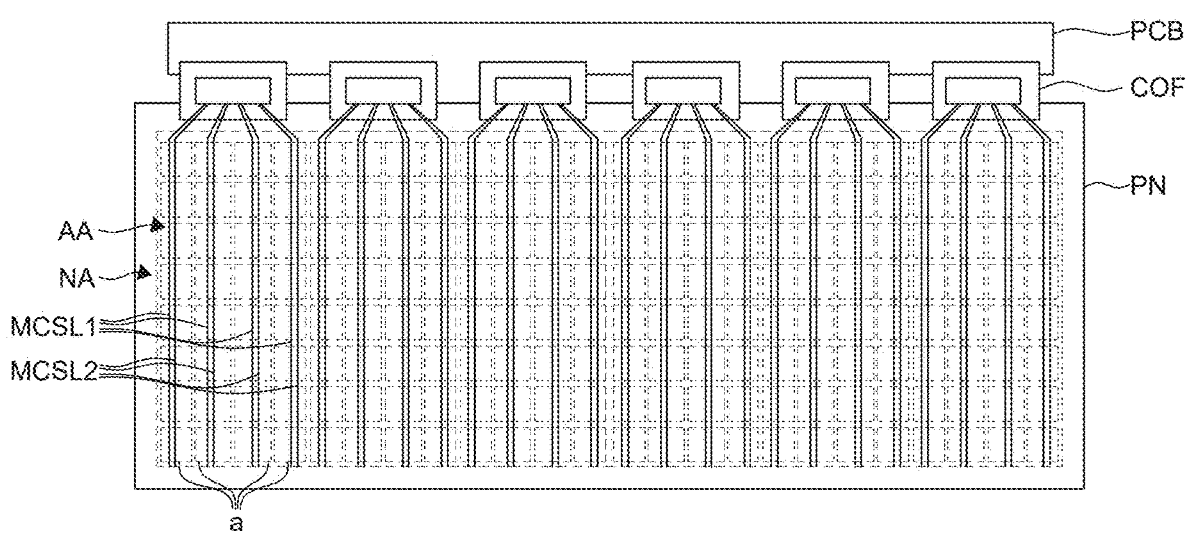
FIG. 5 is a plan view of the display device according to the example embodiment of the present disclosure.

FIG. 5 is a plan view of the display device according to the example embodiment of the present disclosure. Particularly, FIG. 5 illustrates, for convenience of description, only the display panel PN, a plurality of flexible films (chip on film (COF)), and a plurality of printed circuit boards (PCB) among the various components of the display device 100.

Referring to FIG. 5, the display device 100 includes the plurality of flexible films (COF), the plurality of printed circuit boards (PCB), and the display panel PN.

The plurality of flexible films (COF) can be disposed at one end of the display panel PN. The plurality of flexible films (COF) is films in which various components are disposed on a flexible base film to supply signals to the plurality of pixels PX and the driving circuit, and can be electrically connected to the display panel PN. For example, the plurality of flexible films (COF) can supply the power voltage, the data voltage Vdata, etc., to the plurality of pixels PX and the driving circuit.

Meanwhile, driver ICs such as data driver ICs can be disposed on the plurality of flexible films (COF). The driver IC is a component that processes data for displaying images and driving signals for processing the data. According to the mounting method, the driver IC can be disposed as a chip on glass (COG), chip on film (COF), tape carrier package (TCP) manners, etc. However, for convenience of description, it has been described as being a chip on film manner in which the driver IC is mounted on the plurality of flexible films (COF), but the present disclosure is not limited thereto. In addition, the driver IC can be integrated with the timing controller and disposed as a single chip.

Meanwhile, the plurality of mode control units that controls driving in the wide-view mode and the narrow-view mode can be disposed in the driver IC. The mode control unit can provide signals for controlling the mode of the plurality of sub-pixels SP to the plurality of sub-pixels SP. The plurality of mode control units can provide a first mode selection signal for controlling the first mode through a first mode selection signal line MCSL1. In addition, a second mode selection signal for controlling the second mode can be provided through the second mode selection signal line MCSL2. The mode control unit can be defined as a component included in the timing controller TC, or can be defined as a component separate from the timing controller TC.

Each of the plurality of printed circuit boards (PCB) is electrically connected to the plurality of flexible films (COF). The plurality of printed circuit boards (PCB) is components that supply signals to the driver IC. The plurality of printed circuit boards (PCB) can have various components disposed to supply various signals, such as driving signals and data signals, to the driver IC.

The display panel PN can include an active area AA and a non-active area NA surrounding the active area AA. The active area AA of the display panel PN includes a plurality of areas "a" divided in the row direction. The plurality of areas "a" can be areas of pixels PX to which the same mode signal is applied. Meanwhile, FIG. 5 illustrates that the active area AA is divided into 12 areas "a" extending in the column direction, but is not limited thereto.

The display panel PN can include the first mode selection signal line MCSL1 and the second mode selection signal line MCSL2 extending side by side in the row or column direction in the plurality of areas "a". The first mode selection signal line MCSL1 and the second mode selection signal line MCSL2 can each be connected to the mode control unit and transmit the first mode selection signal and the second mode selection signal to the plurality of areas "a". The first mode selection signal transmitted by the first mode selection signal line MCSL1 and the second mode selection signal transmitted by the second mode selection signal line MCSL2 can each be output as a first mode signal MS1 and a second mode signal MS2 with their voltages changed by the level shift which will be described later.

Accordingly, the first mode selection signal line MCSL1 can be referred to as a wide-view mode selection signal line, and the second mode selection signal line MCSL2 can be referred to as a narrow-view mode selection signal line. Meanwhile, FIG. 5 illustrates that the plurality of first mode selection signal lines MCSL1 and the plurality of second mode selection signal lines MCSL2 are extended in the column direction in the plurality of areas "a", but are not limited thereto, and extended in the row direction.

Figure 6:
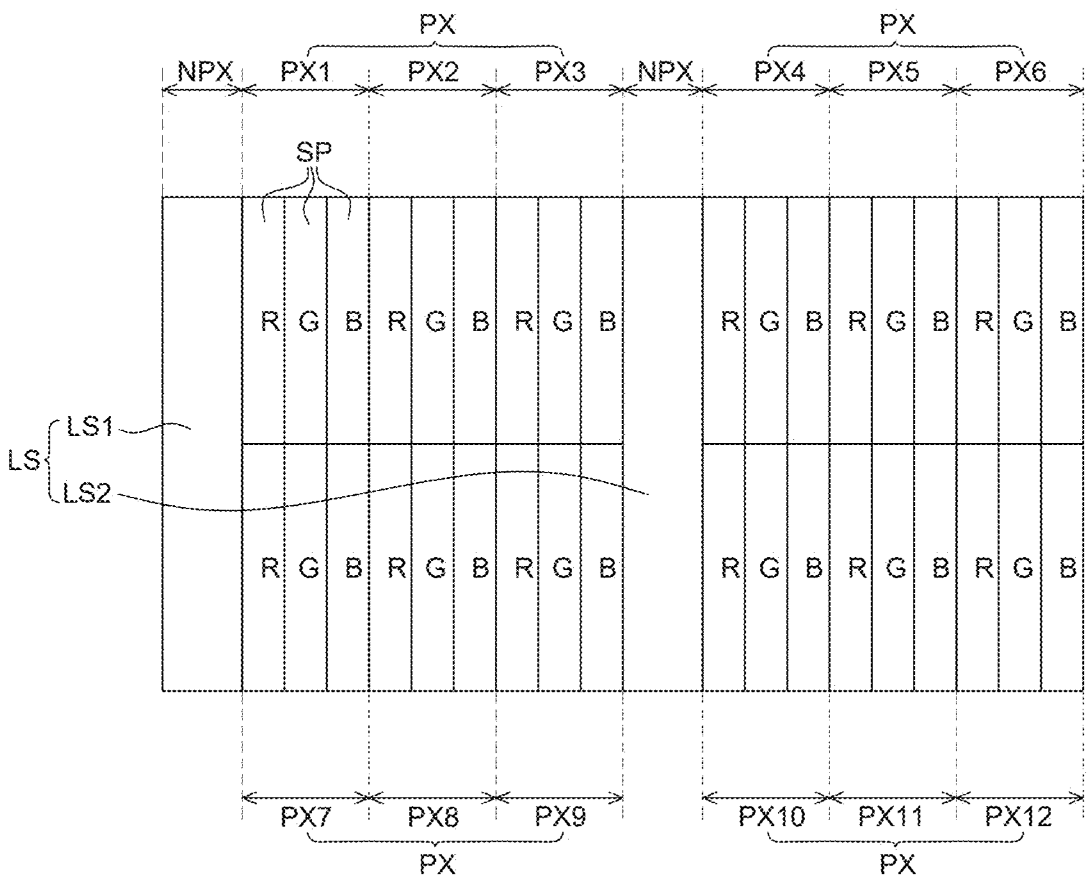
FIG. 6 is a schematic enlarged plan view of an active area of the display device according to the example embodiment of the present disclosure.

FIG. 6 is a schematic enlarged plan view of an active area of the display device according to the example embodiment of the present disclosure. Particularly, FIG. 6 illustrates a portion of one area a of the plurality of areas "a" in FIG. 5, for example, an area corresponding to a total of 12 pixels PX from PX1 to PX12.

Referring to FIG. 6, the level shift LS that provides the mode signal to the plurality of sub-pixels SP is disposed in the active area AA. The level shift LS can provide mode signals MS1 and MS2 that control the driving mode of the display panel PN so that the plurality of sub-pixels SP is driven in either the first mode or the second mode to the plurality of sub-pixels SP. Specifically, the level shift LS can change the output voltages of the first mode selection signal and the second mode selection signal. For example, the level shift LS can change a low voltage output from the mode control unit, for example, 1.8 V or 3.3 V, which is a logic voltage, to a high voltage, for example, a value in the range of VGL (−9.0 V) to VGH (15.0 V). For example, the level shift LS can provide a first mode signal or a second mode signal by changing the output voltages of the first mode selection signal and the second mode selection signal provided by the mode control unit. For example, the level shift LS includes a first level shift LS1 providing the first mode signal MS1 and a second level shift LS2 providing the second mode signal MS2. Accordingly, the first level shift LS1 can be referred to as a wide-view mode level shift since it provides the first mode signal MS1 that controls the driving mode in the wide-view mode, and the second level shift LS2 can also be referred to as a narrow-view mode level shift since it provides the second mode signal MS2 that controls the driving mode in the narrow-view mode.

The first level shift LS1 and the second level shift LS2 can be disposed one by one for each of the plurality of areas "a".

For example, the first level shift LS1 and the second level shift LS2 can each transmit mode signals for each of the plurality of areas "a". For example, the first level shift LS1 and the second level shift LS2 can each be configured in the same number as the plurality of areas "a", and can be disposed one by one for each of the plurality of areas "a".

The plurality of areas "a" includes a pixel PX and a non-pixel area NPX. The pixel PX includes the plurality of sub-pixels SP. The non-pixel area NPX can be disposed between neighboring pixels PX. The non-pixel area NPX can be referred to as the area in which the sub-pixel SP is not disposed.

The first level shift LS1 and the second level shift LS2 are disposed between neighboring pixels PX. For example, when one area "a" includes 12 pixels PX, the first level shift LS1 and the second level shift LS2 can be disposed at an interval of 6 pixels PX. Meanwhile, FIG. 6 illustrates that three pixels PX are disposed in the same row and two pixels PX are disposed in the same column, but this is only shown as an example and the present disclosure is not limited thereto.

Meanwhile, the first level shift LS1 and the second level shift LS2 can each be disposed in the non-pixel area NPX between the pixels PX. However, the present disclosure is not limited thereto, and when one area "a" includes three or more pixels PX, the first level shift LS1 and the second level shift LS2 can each be disposed in two of the plurality of neighboring pixels PX.

Figure 7:
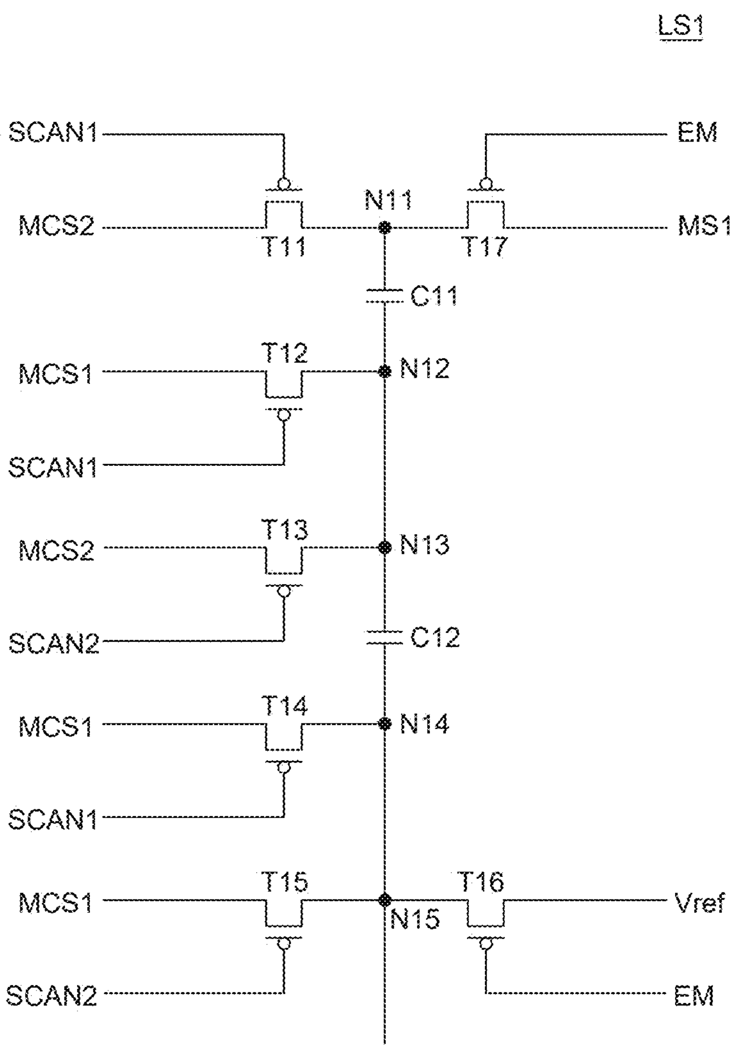
FIG. 7 is a circuit diagram of a first level shift of the display device according to the example embodiment of the present disclosure.

FIG. 7 is a circuit diagram of the first level shift of the display device according to the example embodiment of the present disclosure.

Referring to FIG. 7, the first level shift LS1 includes an eleventh transistor T11, a twelfth transistor T12, a thirteenth transistor T13, a fourteenth transistor T14, a fifteenth transistor T15, a sixteenth transistor T16, a seventeenth transistor T17, an eleventh capacitor C11, and a twelfth capacitor C12.

Meanwhile, the first level shift LS1 is disposed in the active area AA as described above, and therefore, can share the signal lines with the plurality of sub-pixel circuits SPC. For example, the first level shift LS1 can share the first scan signal line, the second scan signal line, and the emission signal line with the sub-pixel circuit SPC.

The eleventh transistor T11 to seventeenth transistor T17 can be p-type thin film transistors. In the case of the P-type thin film transistor, the low-level voltage of each driving signal refers to a voltage that turns on the TFT, and the high-level voltage of each driving signal can refer to a voltage that turns off the TFTs.

The eleventh transistor T11 includes a gate electrode connected to the first scan signal line, a source electrode connected to the second mode selection signal line, and a drain electrode connected to an eleventh node N11 which is a first electrode of the eleventh capacitor C11. Accordingly, the eleventh transistor T11 can be turned on or off by the first scan signal SCAN1 to transmit the second mode selection signal MCS2 to the eleventh node N11 which is the first electrode of the eleventh capacitor C11.

The twelfth transistor T12 includes a gate electrode connected to the first scan signal line, a source electrode connected to the first mode selection signal line, and a drain electrode connected to a twelfth node N12 which is a second electrode of the eleventh capacitor C11. Accordingly, the twelfth transistor T12 can be turned on or off by the first scan signal SCAN1 to transmit the first mode selection signal MCS1 to the twelfth node N12 which is the second electrode of the eleventh capacitor C11.

The thirteenth transistor T13 includes a gate electrode connected to the second scan signal line, a source electrode connected to the second mode selection signal line, and a drain electrode connected to a thirteenth node N13 which is a first electrode of the twelfth capacitor C12. Accordingly, the thirteenth transistor T13 can be turned on or off by the second scan signal SCAN2 to transmit the second mode selection signal MCS2 to the thirteenth node N13 which is the first electrode of the twelfth capacitor C12.

The fourteenth transistor T14 includes a gate electrode connected to the first scan signal line, a source electrode connected to the first mode selection signal line, and a drain electrode connected to a fourteenth node N14 which is a second electrode of the twelfth capacitor C12. Accordingly, the fourteenth transistor T14 can be turned on or off by the first scan signal SCAN1 to transmit the first mode selection signal MCS1 to the fourteenth node N14 which is the second electrode of the twelfth capacitor C12.

The fifteenth transistor T15 includes a gate electrode connected to the second scan signal line, a source electrode connected to the first mode selection signal line, and a drain electrode connected to a fifteenth node N15. Accordingly, the fifteenth transistor T15 can be turned on or off by the second scan signal SCAN2 to transmit the first mode selection signal MCS1 to the fourteenth node N14 which is the second electrode of the twelfth capacitor C12.

The sixteenth transistor T16 includes a gate electrode connected to the emission signal line, a source electrode connected to a reference line transmitting the reference voltage Vref, and a drain electrode connected to the fifteenth node N15. Accordingly, the sixteenth transistor T16 is turned on or off by the emission signal EM to transmit the reference voltage Vref to the fourteenth node N14 which is the second electrode of the twelfth capacitor C12.

The seventeenth transistor T17 includes a gate electrode connected to the emission signal line, a source electrode connected to the eleventh node N11 which is the first electrode of the eleventh capacitor C11, and a drain electrode connected to the plurality of sub-pixels SP. Accordingly, the seventeenth transistor T17 is turned on or off by the emission signal EM to transmit the first mode signal MS1 to the plurality of sub-pixels SP.

The eleventh capacitor C11 includes a first electrode connected to the eleventh node N11 and a second electrode connected to the twelfth node N12. The twelfth capacitor C12 includes a first electrode connected to the thirteenth node N13 and a second electrode connected to the fourteenth node N14. Meanwhile, the eleventh capacitor C11 and the twelfth capacitor C12 can be connected in series.

Figure 8:
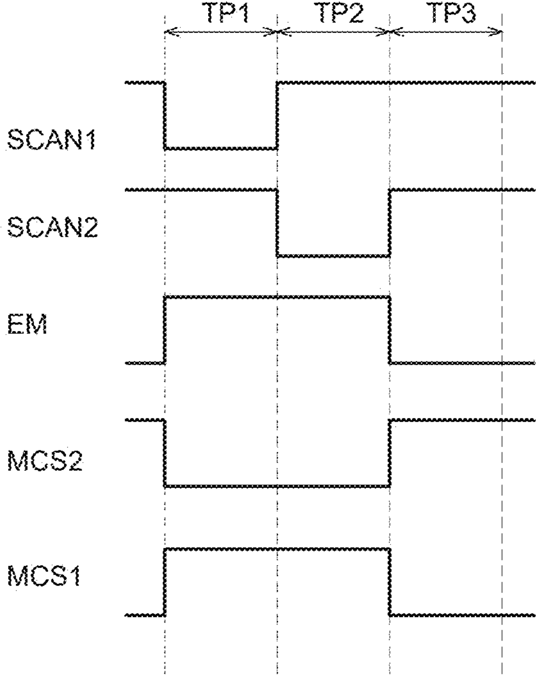
FIG. 8 is a waveform diagram for describing the first level shift of the display device according to the example embodiment of the present disclosure.
Figure 9A:
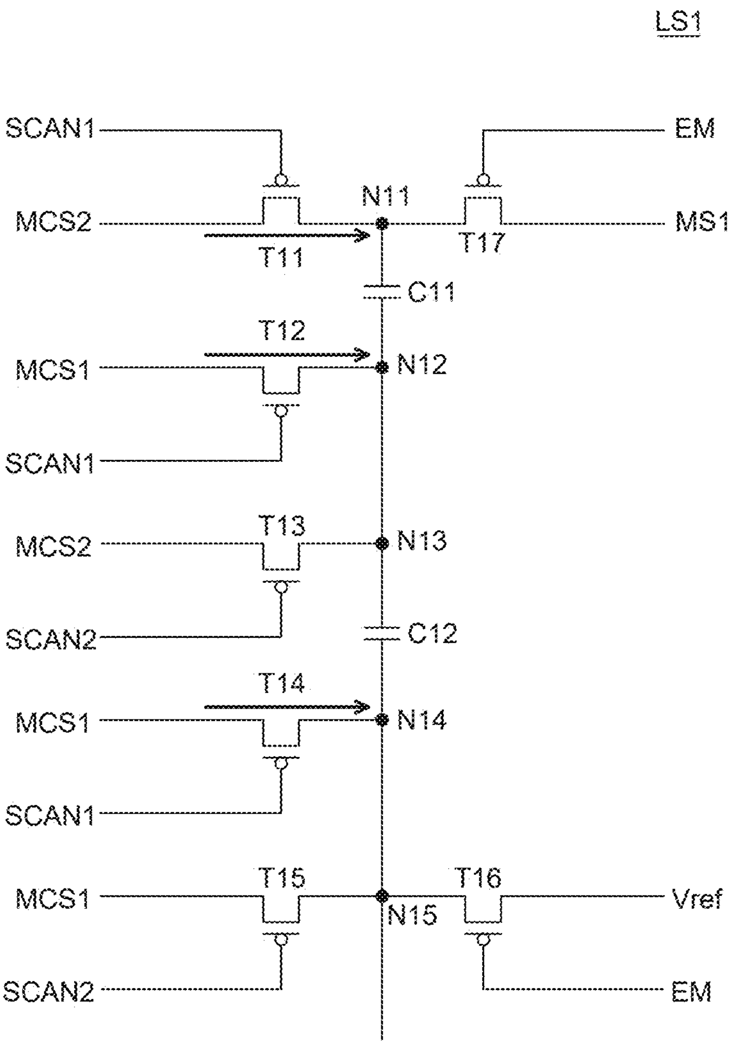
FIG. 9A is a circuit diagram of the first level shift of the display device according to the example embodiment of the present disclosure during a first period, in a wide-view mode.
Figure 9B:
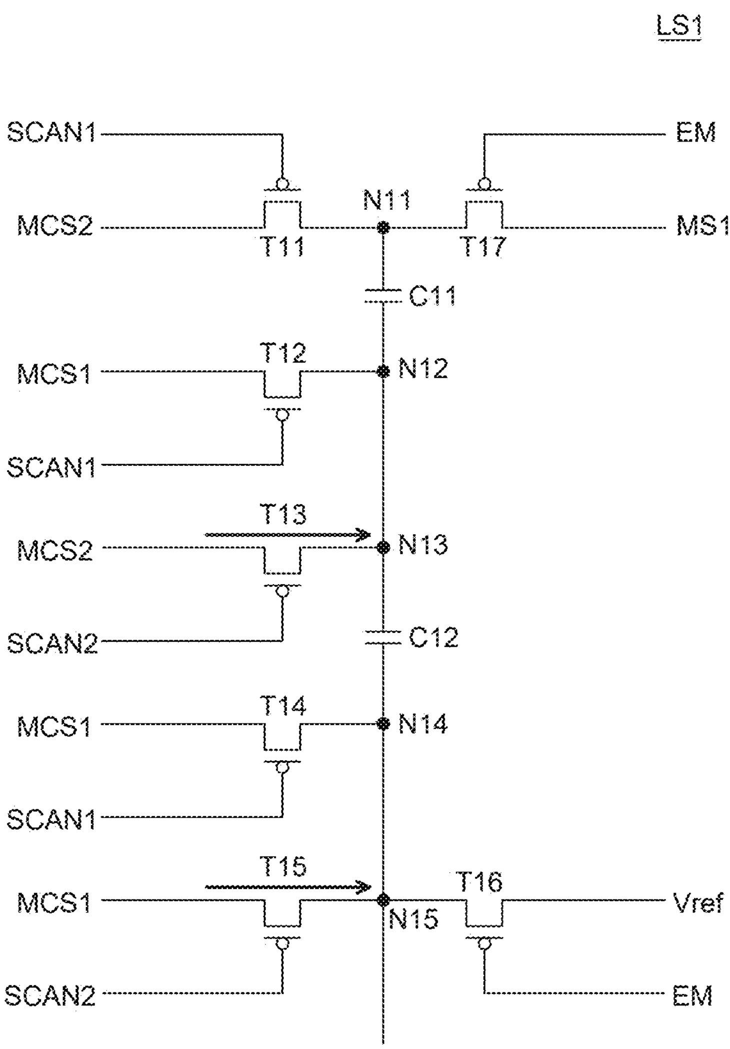
FIG. 9B is a circuit diagram of the first level shift of the display device according to the example embodiment of the present disclosure during a second period, in a wide-view mode.
Figure 9C:
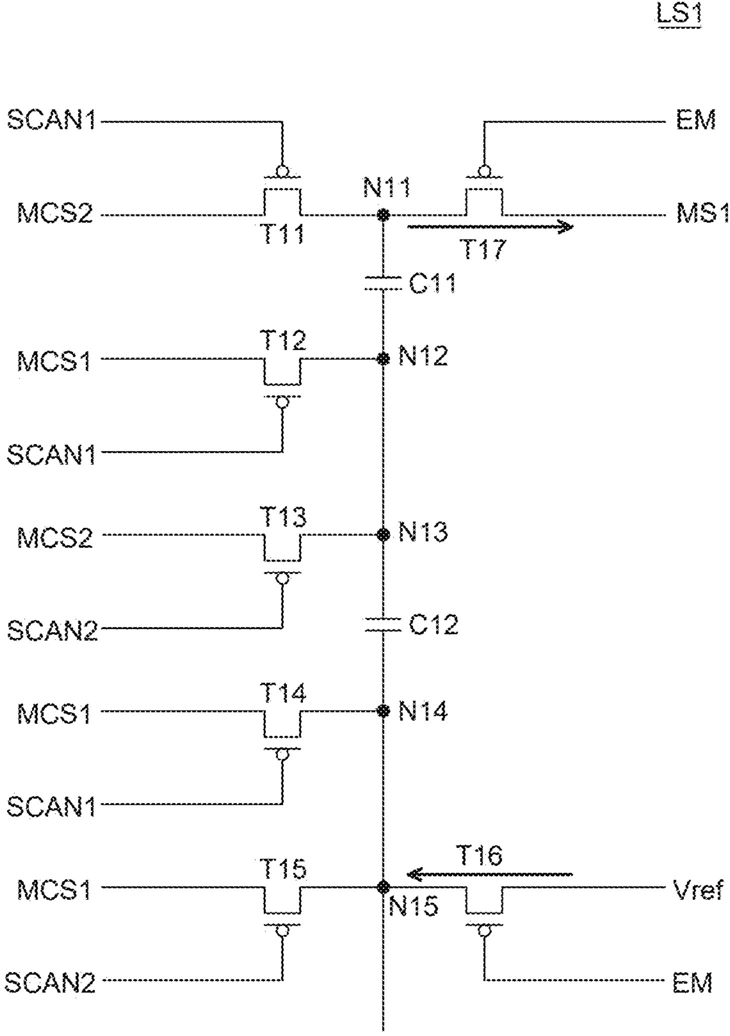
FIG. 9C is a circuit diagram of the first level shift of the display device according to the example embodiment of the present disclosure during a third period, in a wide-view mode.

FIG. 8 is a waveform diagram for describing the first level shift circuit of the display device according to the example embodiment of the present disclosure. FIG. 9A is a circuit diagram of the first level shift of the display device according to the example embodiment of the present disclosure during a first period, in the wide-view mode. FIG. 9B is a circuit diagram of the first level shift of the display device according to the example embodiment of the present disclosure during a second period, in the wide-view mode. FIG. 9C is a circuit diagram of the first level shift of the display device according to the example embodiment of the present disclosure during a third period, in the wide-view mode.

Hereinafter, a voltage value corresponding to the first mode selection signal MCS1 can be referred to as a first voltage "V1", and a voltage value corresponding to the second mode selection signal MCS2 can be referred to as a second voltage "V2".

Referring to FIGS. 8 and 9A together, in the wide-view mode, the low-level first scan signal SCAN1 and the low-level second mode selection signal MCS2 can be output during the first period TP1. Accordingly, the eleventh transistor T11, the twelfth transistor T12, and the fourteenth transistor T14 can be turned on by the low-level first scan signal SCAN1.

The second voltage "V2" can be applied to the eleventh node N11 by the turned-on eleventh transistor T11. The first voltage "V1" can be applied to the twelfth node N12 by the turned-on twelfth transistor T12. The first voltage "V1" can be applied to the fourteenth node N14 by the turned-on fourteenth transistor T14.

Accordingly, during the first period TP1, the voltage of the eleventh node N11 can be "V2", and the voltages of the twelfth node N12 and the thirteenth node N13 can be "V1". In addition, the eleventh capacitor C11 can store "V2−V1", which is a voltage difference between two electrodes, for example, a voltage difference between the eleventh node N11 and the twelfth node N12.

Next, referring to FIGS. 8 and 9B together, the low-level second scan signal SCAN2 and the low-level second mode selection signal MCS2 can be output during the second period TP2. Accordingly, the thirteenth transistor T13 and the fifteenth transistor T15 can be turned on by the low-level second scan signal SCAN2.

The second voltage "V2" can be applied to the thirteenth node N13 by the turned-on thirteenth transistor T13. The first voltage "V1" can be applied to the fifteenth node N15 by the turned-on fifteenth transistor T15.

In this case, since the twelfth node N12 and the thirteenth node N13 have the same voltage, the voltage of the twelfth node N12 can be "V2". In addition, the voltage of the eleventh node N11 is a value obtained by adding the voltage "V2−V1" stored in the eleventh capacitor C11 to the voltage "V2" of the twelfth node N12, so the voltage of the eleventh node N11 can be "V2+(V2−V1)". In addition, since the fourteenth node N14 and the fifteenth node N15 have the same voltage, the voltage of the fourteenth node N14 can be "V1". In addition, the twelfth capacitor C12 can store "V2−V1", which is a voltage difference between two electrodes, for example, a voltage difference between the thirteenth node N13 and the fourteenth node N14.

Finally, referring to FIGS. 8 and 9C together, the low-level emission signal EM and the low-level first mode selection signal MCS1 can be output during the third period TP3. Accordingly, the sixteenth transistor T16 and the seventeenth transistor T17 can be turned on by the low-level emission signal EM.

The reference voltage Vref can be applied to the fifteenth node N15 by the turned-on sixteenth transistor T16. The first mode signal MS1 can be output to the plurality of sub-pixels SP by the turned-on seventeenth transistor T17.

In this case, since the fourteenth node N14 and the fifteenth node N15 have the same voltage, the voltage of the fourteenth node N14 can be "Vref". In addition, the voltage of the thirteenth node N13 is a value obtained by adding the voltage "V2−V1" stored in the twelfth capacitor C12 to the voltage "Vref" of the fourteenth node N14, so the voltage of the thirteenth node N13 can be "V2+(Vref−V1)". In addition, since the twelfth node N12 and the thirteenth node N13 have the same voltage, the voltage of the twelfth node N12 can be "V2+(Vref−V1)". In addition, the voltage of the eleventh node N11 is a value obtained by adding the voltage "V2−V1" stored in the eleventh capacitor C11 to the voltage "V2+(Vref−V1)" of the twelfth node N12, so the voltage of the eleventh node N11 can be "V2+(V2−V1)+(Vref−V1)".

In this case, the first mode signal MS1 can be output through the seventeenth transistor T17 connected to the eleventh node N11. In other words, "V2+(V2−V1)+(Vref−V1)", which is the voltage of the eleventh node N11, can be the voltage value of the first mode signal MS1, and since the low-level first mode signal MS1 is a turn-on signal, the second voltage value "V2" can be set to be smaller than the first voltage value "V1".

Figure 10:
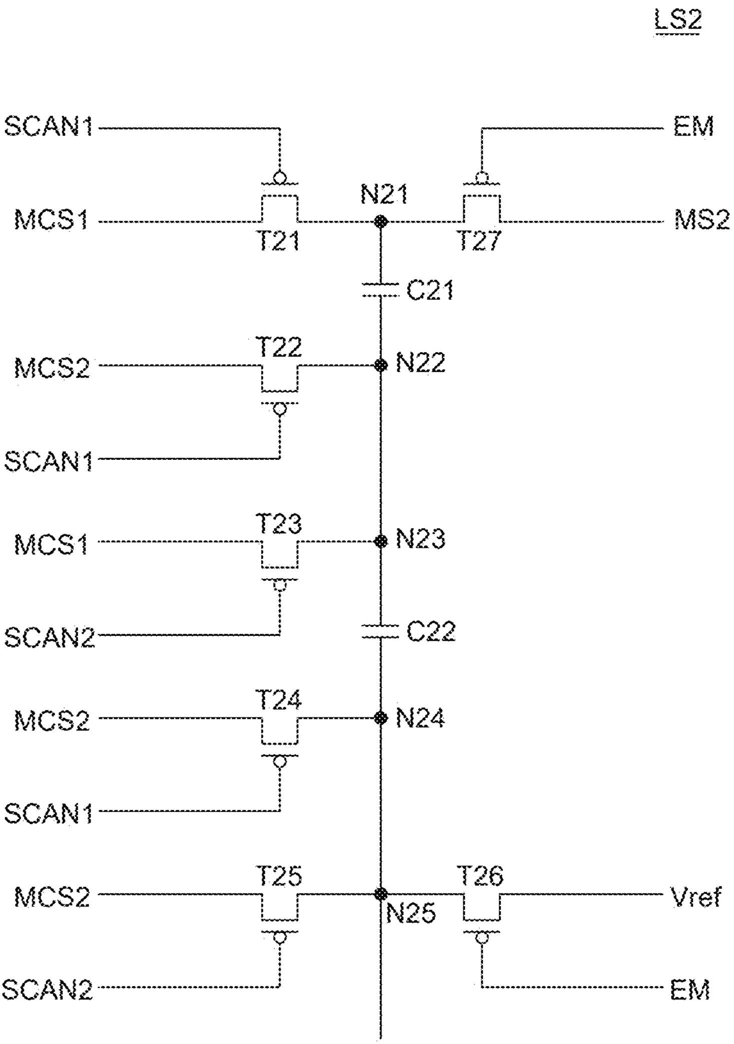
FIG. 10 is a circuit diagram of a second level shift of the display device according to the example embodiment of the present disclosure.

FIG. 10 is a circuit diagram of the second level shift of the display device according to the example embodiment of the present disclosure.

Referring to FIG. 10, the second level shift LS2 includes a twenty-first transistor T21, a twenty-second transistor T22, a twenty-third transistor T23, a twenty-fourth transistor T24, a twenty-fifth transistor T25, a twenty-sixth transistor T26, a twenty-seventh transistor T27, a twenty-first capacitor C21, and a twenty-second capacitor C22.

Meanwhile, the second level shift LS2 is disposed in the active area AA, and therefore, can share the signal lines with the plurality of sub-pixel circuits SPC. For example, the second level shift circuit LS2 can share the first scan signal line, the second scan signal line, and the emission signal line of the display panel with the sub-pixel circuit SPC.

The twenty-first transistor T21 to twenty-seventh transistor T27 can be p-type thin film transistors. In the case of the p-type thin film transistor, the low-level voltage of each driving signal refers to a voltage that turns on the TFT, and the high-level voltage of each driving signal can refer to a voltage that turns off the TFTs.

The twenty-first transistor T21 includes a gate electrode connected to the first scan signal line, a source electrode connected to the first mode selection signal line, and a drain electrode connected to a twenty-first node N21 which is a first electrode of the twenty-first capacitor C21. Accordingly, the twenty-first transistor T21 can be turned on or off by the first scan signal SCAN1 to transmit the first mode selection signal MCS1 to the twenty-first node N21 which is the first electrode of the twenty-first capacitor C21.

The twenty-second transistor T22 includes a gate electrode connected to the first scan signal line, a source electrode connected to the second mode selection signal line, and a drain electrode connected to a twenty-second node N22 which is a second electrode of the twenty-first capacitor C21. Accordingly, the twenty-second transistor T22 can be turned on or off by the first scan signal SCAN1 to transmit the second mode selection signal MCS2 to the twenty-second node N22 which is the second electrode of the twenty-first capacitor C21.

The twenty-third transistor T23 includes a gate electrode connected to the second scan signal line, a source electrode connected to the first mode selection signal line, and a drain electrode connected to a twenty-third node N23 which is a first electrode of the twenty-second capacitor C22. Accordingly, the twenty-third transistor T23 can be turned on or off by the second scan signal SCAN2 to transmit the first mode selection signal MCS1 to the twenty-third node N23 which is the first electrode of the twenty-second capacitor C22.

The twenty-fourth transistor T24 includes a gate electrode connected to the first scan signal line, a source electrode connected to the second mode selection signal line, and a drain electrode connected to a twenty-fourth node N24 which is a second electrode of the twenty-second capacitor C22. Accordingly, the twenty-fourth transistor T24 can be turned on or off by the first scan signal SCAN1 to transmit the second mode selection signal MCS2 to the twenty-fourth node N24 which is the second electrode of the twenty-second capacitor C22.

The twenty-fifth transistor T25 includes a gate electrode connected to the second scan signal line, a source electrode connected to the second mode selection signal line, and a drain electrode connected to a twenty-fifth node N25. Accordingly, the twenty-fifth transistor T25 can be turned on or off by the second scan signal SCAN2 to transmit the second mode selection signal MCS2 to the twenty-fourth node N24 which is the second electrode of the twenty-second capacitor C22.

The twenty-sixth transistor T26 includes a gate electrode connected to the emission signal line, a source electrode connected to a reference line transmitting the reference voltage Vref, and a drain electrode connected to the twenty-fifth node N25. Accordingly, the twenty-sixth transistor T26 is turned on or off by the emission signal EM to transmit the reference voltage Vref to the twenty-fourth node N24 which is the second electrode of the twenty-second capacitor C22.

The twenty-seventh transistor T27 includes a gate electrode connected to the emission signal line, a source electrode connected to the twenty-first node N21, and a drain electrode connected to the plurality of sub-pixels SP. Accordingly, the twenty-seventh transistor T27 is turned on or off by the emission signal EM to transmit the second mode signal MS2 to the plurality of sub-pixels SP.

The twenty-first capacitor C21 includes a first electrode connected to the twenty-first node N21 and a second electrode connected to the twenty-second node N22. The twenty-second capacitor C22 includes a first electrode connected to the twenty-third node N23 and a second electrode connected to the twenty-fourth node N24. Meanwhile, the twenty-first capacitor C21 and the twenty-second capacitor C22 can be connected in series.

Figure 11:
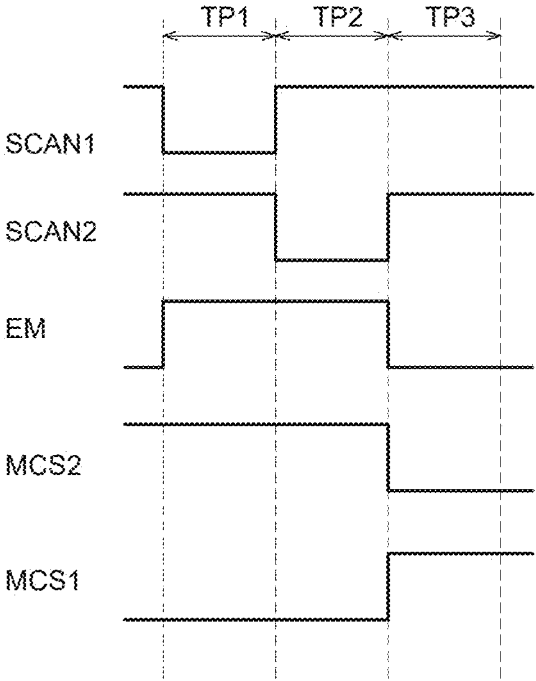
FIG. 11 is a waveform diagram for describing the second level shift of the display device according to the example embodiment of the present disclosure.
Figure 12A:
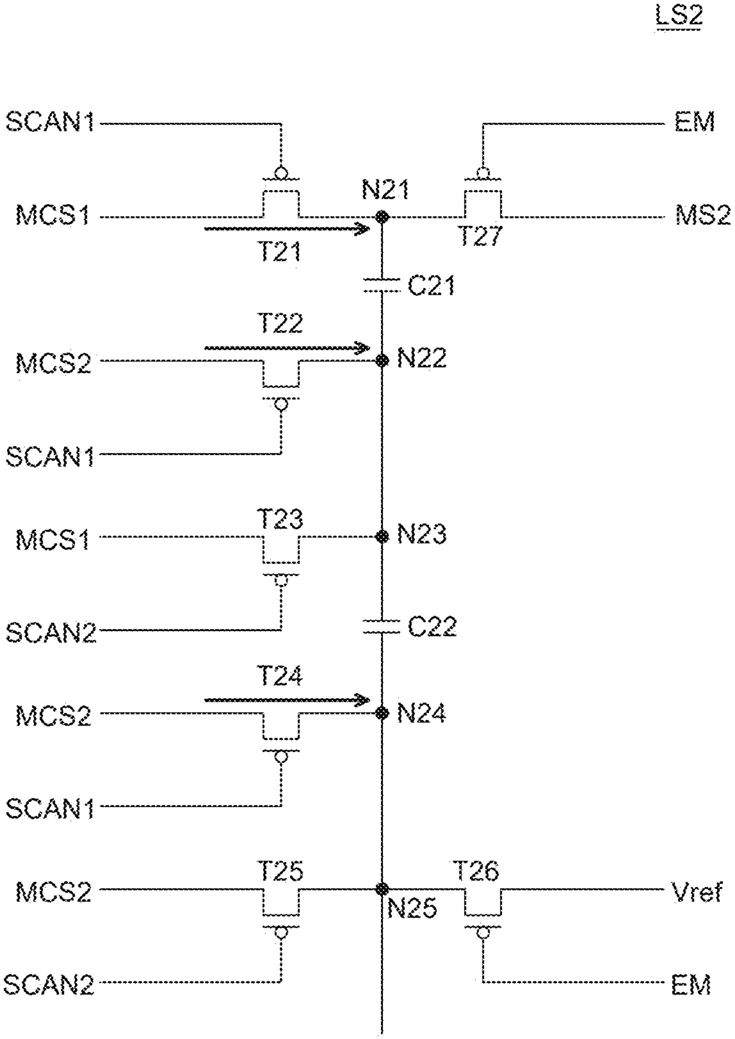
FIG. 12A is a circuit diagram of the second level shift of the display device according to the example embodiment of the present disclosure during the first period, in a narrow-view mode.
Figure 12B:
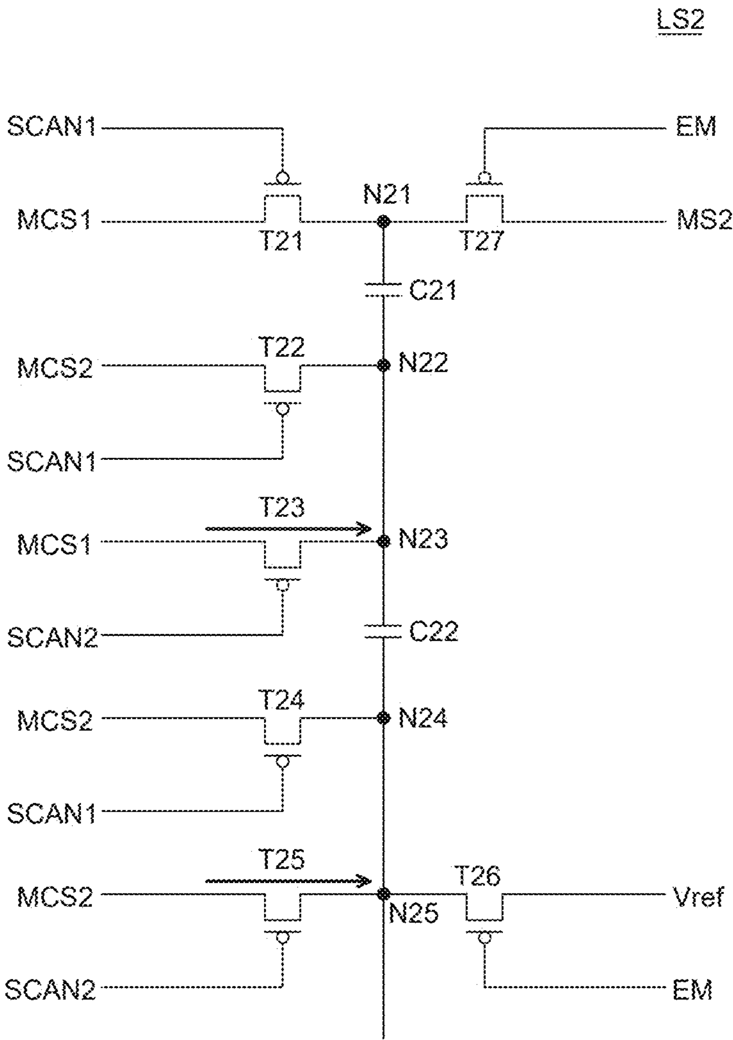
FIG. 12B is a circuit diagram of the second level shift of the display device according to the example embodiment of the present disclosure during the second period, in the narrow-view mode.
Figure 12C:
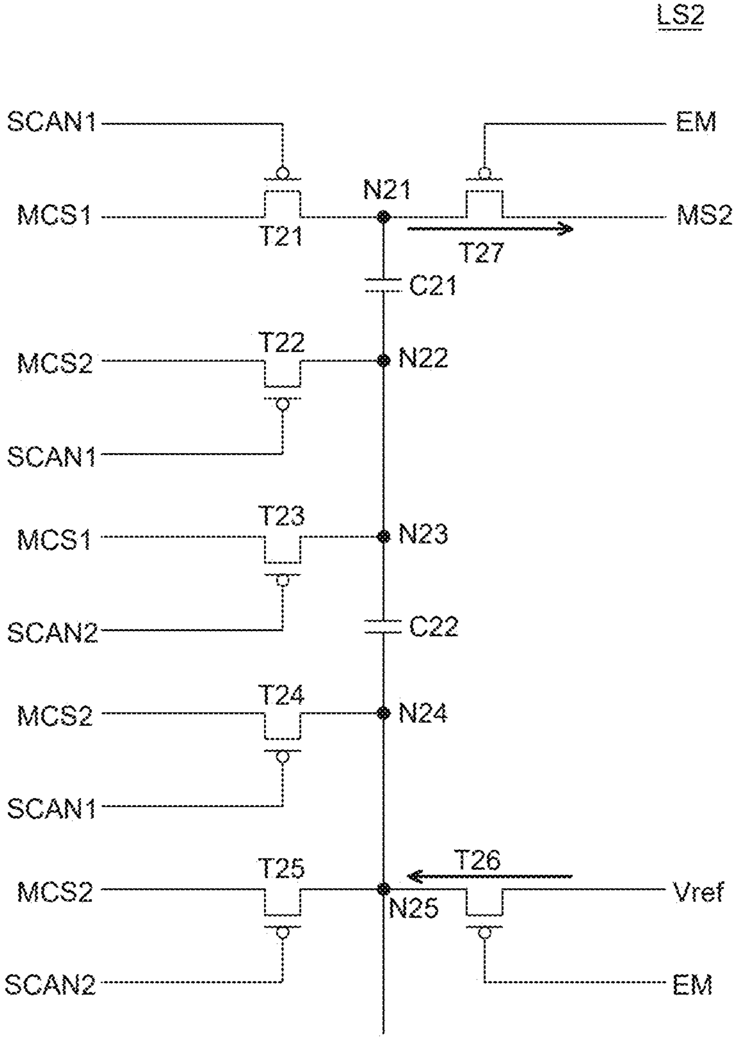
FIG. 12C is a circuit diagram of the second level shift of the display device according to the example embodiment of the present disclosure during the third period, in the narrow-view mode.

FIG. 11 is a waveform diagram for describing the second level shift of the display device according to the example embodiment of the present disclosure. FIG. 12A is a circuit diagram of the second level shift of the display device according to the example embodiment of the present disclosure during the first period, in the narrow-view mode. FIG. 12B is a circuit diagram of the second level shift of the display device according to the example embodiment of the present disclosure during the second period, in the narrow-view mode. FIG. 12C is a circuit diagram of the second level shift of the display device according to the example embodiment of the present disclosure during the third period, in the narrow-view mode.

Hereinafter, the voltage value corresponding to the first mode selection signal MCS1 can be referred to as the first voltage "V1", and the voltage value corresponding to the second mode selection signal MCS2 can be referred to as the second voltage "V2".

Referring to FIGS. 11 and 12A, in the narrow-view mode, the low-level first scan signal SCAN1 and the low-level first mode selection signal MCS1 can be output during the first period TP1. Accordingly, the twenty-first transistor T21, the twenty-second transistor T22, and the twenty-fourth transistor T24 can be turned on by the low-level first scan signal SCAN1.

The first voltage "V1" can be applied to the twenty-first node N21 by the turned-on twenty-first transistor T21. The second voltage "V2" can be applied to the twenty-second node N22 by the turned-on twenty-second transistor T22. The second voltage "V2" can be applied to the twenty-fourth node N24 by the turned-on twenty-fourth transistor T24.

Next, referring to FIGS. 11 and 12B, the low-level second scan signal SCAN2 and the low-level first mode selection signal MCS1 can be output during g the second period TP2. Accordingly, the twenty-third transistor T23 and the twenty-fifth transistor T25 can be turned on by the low-level second scan signal SCAN2.

The first voltage "V1" can be applied to the twenty-third node N23 by the turned-on twenty-third transistor T23. The second voltage "V2" can be applied to the twenty-fifth node N25 by the turned-on twenty-fifth transistor T25.

In this case, since the twenty-second node N22 and the twenty-third node N23 have the same voltage, the voltage of the twenty-second node N22 can be "V1". In addition, the voltage of the twenty-first node N21 is a value obtained by adding the voltage "V1−V2" stored in the twenty-first capacitor C21 to the voltage "V1" of the twenty-second node N22, so the voltage of the twenty-first N21 can be "V1+(V1−V2)". In addition, since the twenty-fourth node N24 and the twenty-fifth node N25 have the same voltage, the voltage of the twenty-fourth node N24 can be "V2". In addition, the twenty-second capacitor C22 can store "V1−V2", which is a voltage difference between two electrodes, for example, a voltage difference between the twenty-third node N23 and the twenty-fourth node N24.

Finally, referring to FIGS. 11 and 12C, the low-level emission signal EM and the low-level second mode selection signal MCS2 can be output during the third period TP3. Accordingly, the twenty-sixth transistor T26 and the twenty-seventh transistor T27 can be turned on by the low-level emission signal EM.

The reference voltage Vref can be applied to the twenty-fifth node N25 by the turned-on twenty-sixth transistor T26. The second mode signal MS2 can be output by the turned-on twenty-seventh transistor T27.

In this case, since the twenty-fourth node N24 and the twenty-fifth node N25 have the same voltage, the voltage of the twenty-fourth node N24 can be "Vref". In addition, the voltage of the twenty-third node N23 is a value obtained by adding the voltage "V1−V2" stored in the twenty-second capacitor C22 to the voltage "Vref" of the twenty-fourth node N24, so the voltage of the twenty-third node N23 can be "V1+(Vref−V2)". In addition, since the twenty-second node N22 and the twenty-third node N23 have the same voltage, the voltage of the twenty-second node N22 can be "V1+(Vref−V2)". In addition, the voltage of the twenty-first node N21 is a value obtained by adding the voltage "V1−V2" stored in the twenty-first capacitor C21 to the voltage "V1+(Vref−V2)" of the twenty-second node N22, so the voltage of the twenty-first node N21 can be "V1+(V1−V2)+(Vref−V2)".

In this case, the second mode signal MS2 can be output through the twenty-seventh transistor T27 connected to the twenty-first node N21. In other words, "V1+(V1−V2)+(Vref−V2)", which is the voltage of the twenty-first node N21, can be the voltage value of the second mode signal MS2, and since the low-level second mode signal MS2 is a turn-on signal, the first voltage value "V1" can be set to be smaller than the second voltage value "V2".

Meanwhile, in order to implement various viewing angles, the display device can be driven by being divided into the wide-view mode or narrow-view mode for each area. In general, the control signals can be output from the mode control unit that controls the wide-view mode or narrow-view mode operation, and can be changed to a desired voltage through the level shift and transmitted to the display panel. This is because, usually, the voltage output from the mode control unit is a low voltage of about 1.8 V or 3.3 V, and the voltage of the control signals used in the display panel is a high voltage, as a VGH voltage of 10.0 V or more and a VGL voltage of −9.0 V or less. For example, since there is a difference between the voltage output from the mode control unit and the voltage used in the display panel, a separate IC for level shift is required to change the low control voltage to the high control voltage. In this case, manufacturing costs increase due to the use of a separate IC, or the bezel increases to secure a space for disposing the IC for level shift. In addition, since the output channel of one IC for level shift is limited, one or more ICs for level shift can be required to implement various viewing angles. In this case, there is a problem in that line routing becomes complicated due to additional line connections.

Accordingly, in the display device 100 according to the example embodiment of the present disclosure, the level shift LS is disposed in the active area AA. For example, since there is no need to dispose a separate IC for level shift on the flexible film (COF), the manufacturing costs can be reduced. In addition, since there is no need to secure the space in the non-active area NA to dispose a line for connecting a separate IC and the display panel PN, the area of the non-active area NA can be minimized. In other words, it is possible to implement a narrow bezel.

In addition, in the display device 100 according to the example embodiment of the present disclosure, the level shift LS can share the first scan signal line, the second scan signal line, and the emission signal line disposed on the display panel PN with the sub-pixel circuit SPC. Accordingly, the increase in the bezel due to additional line disposition can be minimized, and the design complexity due to additional line disposition can be minimized. In addition, the level shift LS disposed in the active area AA and the number of lines added to drive the level shift LS can be minimized, and by disposing the level shift LS in the active area AA, the area that should be secured within the active area AA can also be minimized.

In addition, in the display device 100 according to the example embodiment of the present disclosure, the level shift LS includes the first level shift LS1 which transmits the first mode signal MS1 and a second level shift LS2 which transmits the second mode signal MS2. In this case, the first level shift LS1 and the second level shift LS2 are disposed for each of the plurality of divided areas "a" of the active area AA. Accordingly, in the display device 100 according to the example embodiment of the present disclosure, the wide-view mode and narrow-view mode can be independently controlled for each of the plurality of areas "a". For example, in the display device 100 according to the example embodiment of the present disclosure, the level shift LS can be disposed for each area of the sub-pixel SP, so the viewing angle can be freely and selectively limited for each of the plurality of areas. For example, in the display device 100 according to the example embodiment of the present disclosure, the viewing angle can be selectively limited by selectively and freely switching only a specific area of the screen to either the wide-view mode or narrow-view mode, and the driving area can be changed in the wide-view mode and the narrow-view mode.

The example embodiments of the present disclosure can also be described as follows:

According to an aspect of the present disclosure, there is provided a display device. The display device includes a display panel including an active area in which a plurality of sub-pixels are disposed and a non-active area adjacent to the active area and a plurality of level shift circuits disposed in the active area and configured to transmit a mode signal to drive the plurality of sub-pixels in either a first mode or a second mode. Each of the plurality of sub-pixels includes a first light emitting element, a first optical member configured to refract light from the first light emitting element, a second light emitting element and a second optical member configured to refract light from the second light emitting element and having a different shape from the first optical member.

The plurality of level shift circuits can include a plurality of first level shift circuits configured to transmit a first mode signal and a plurality of second level shift circuits configured to transmit a second mode signal. The active area can include a plurality of areas divided in a row or column direction. The plurality of first level shift circuits and the plurality of second level shift circuits can be each disposed one by one for each of the plurality of areas.

The plurality of first level shift circuits and the plurality of second level shift circuits can transmit the respective mode signals for each of the plurality of areas.

For the plurality of sub-pixels, a plurality of sub-pixel circuits can be disposed. The plurality of first level shift circuits and the plurality of second level shift circuits can share signal lines with the plurality of sub-pixel circuits.

The display panel can include a first scan signal line, a second scan signal line, and an emission signal line. Each of the plurality of sub-pixel circuits can include a driving transistor, a first transistor configured to apply a data voltage to a capacitor, a second transistor diode-connecting a gate electrode and a drain electrode of the driving transistor, a third transistor configured to apply a reference voltage to the capacitor, a fourth transistor forming a current path between the driving transistor and the first light emitting element, a fifth transistor configured to apply the reference voltage to an anode electrode of the first light emitting element, a sixth transistor configured to apply the reference voltage to an anode electrode of the second light emitting element, a seventh transistor forming the current path between the driving transistor and the second light emitting element and an eighth transistor connecting the driving transistor, the fourth transistor and the seventh transistor.

In the first mode, the fourth transistor can be turned on and the seventh transistor can be turned off. In the second mode, the fourth transistor can be turned off and the seventh transistor can be turned on.

One first level shift circuit among the plurality of first level shift circuits can include a first capacitor, a second capacitor connected in series with the first capacitor, a first transistor connected to the first scan signal line and configured to transmit a second mode selection signal to a first electrode of the first capacitor, a second transistor connected to the first scan signal line and configured to transmit a first mode selection signal to a second electrode of the first capacitor, a third transistor connected to the second scan signal line and configured to transmit the second mode selection signal to a first electrode of the second capacitor, a fourth transistor connected to the first scan signal line and configured to transmit the first mode selection signal to a second electrode of the second capacitor, a fifth transistor connected to the second scan signal line and configured to transmit the first mode selection signal to the second electrode of the second capacitor, a sixth transistor connected to the emission signal line and configured to transmit the reference voltage to the second electrode of the second capacitor and a seventh transistor connected to the emission signal line and configured to output the first mode signal.

The one first level shift circuit can be driven separately into a first period, a second period, and a third period. During the first period, a first scan signal and the second mode selection signal can be turn-on signals. During the second period, a second scan signal and the second mode selection signal can be turn-on signals. During the third period, an emission signal and the first mode selection signal can be turn-on signals.

One second level shift circuit among the plurality of second level shift circuits can include a first transistor connected to the first scan signal line and configured to transmit a first mode selection signal to a first electrode of a first capacitor, a second transistor connected to the first scan signal line and configured to transmit a second mode selection signal to a second electrode of the first capacitor, a third transistor connected to the second scan signal line and configured to transmit the first mode selection signal to a first electrode of a second capacitor, a fourth transistor connected to the first scan signal line and configured to transmit the second mode selection signal to a second electrode of the second capacitor, a fifth transistor connected to the second scan signal line and configured to transmit the second mode selection signal to the second electrode of the second capacitor, a sixth transistor connected to the emission signal line and configured to transmit the reference voltage to the second electrode of the second capacitor and a seventh transistor connected to the emission signal line and configured to output the second mode signal.

The one second level shift circuit can be driven separately into a first period, a second period, and a third period. During the first period, a first scan signal and the first mode selection signal can be turn-on signals. During the second period, a second scan signal and the first mode selection signal can be turn-on signals. During the third period, an emission signal and the second mode selection signal can be turn-on signals.

The display device can further include a plurality of mode control units disposed in the non-active area. The display panel can include a first mode selection signal line extending in a row or column direction in the plurality of areas and connected to the mode control unit to transmit a first mode selection signal to the plurality of sub-pixels and a second mode selection signal line extending in the row or column direction in the plurality of areas and connected to the mode control unit to transmit a second mode selection signal to the plurality of sub-pixels.

The display panel can include a driving transistor and first to eighth transistors. Each of the plurality of sub-pixels can be driven separately into an initial period, a sampling period, a holding period, and an emission period. During the initial period, a voltage of a gate electrode of the driving transistor is initialized, and an anode electrode of the first light emitting element and an anode electrode of the second light emitting element are initialized, respectively. During the sampling period, a threshold voltage of the driving transistor is sampled. During the holding period, the first to eighth transistors are turned-off. During the emission period, a driving current to each of the first light emitting element and the second light emitting element is applied so that each of the first light emitting element and the second light emitting element emits light.

In the first mode, the first light emitting element emits light, and the light from the first light emitting element can be output with a viewing angle limited in a first direction and a second direction by the first optical member. In the second mode, the second light emitting element emits light, and the light from the second light emitting element can be output with a viewing angle limited only in the first direction by the second optical member.

The plurality of first level shift circuits and the plurality of second level shift circuits are each configured in a same number as the plurality of areas.

Although the example embodiments of the present disclosure have been described in detail with reference to the accompanying drawings, the present disclosure is not limited thereto and can be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. All the technical concepts in the equivalent scope of the present disclosure should be construed as falling within the scope of the present disclosure.

What is claimed is:

1. A display device, comprising:
- a display panel including an active area in which a plurality of sub-pixels are disposed and a non-active area adjacent to the active area; and
- a plurality of level shift circuits disposed in the active area and configured to transmit a mode signal to drive the plurality of sub-pixels in either a first mode or a second mode,
- wherein each of the plurality of sub-pixels includes:
  - a first light emitting element;
  - a first optical member configured to refract light from the first light emitting element;
  - a second light emitting element; and
  - a second optical member configured to refract light from the second light emitting element and having a different shape from the first optical member,
- wherein the display panel includes a first scan signal line, a second scan signal line, and an emission signal line,
- wherein each of a plurality of sub-pixel circuits includes:
  - a driving transistor;
  - a first transistor configured to apply a data voltage to a capacitor;
  - a second transistor diode connecting a gate electrode and a drain electrode of the driving transistor;
  - a third transistor configured to apply a reference voltage to the capacitor;
  - a fourth transistor forming a current path between the driving transistor and the first light emitting element;
  - a fifth transistor configured to apply the reference voltage to an anode electrode of the first light emitting element;
  - a sixth transistor configured to apply the reference voltage to an anode electrode of the second light emitting element;
  - a seventh transistor forming the current path between the driving transistor and the second light emitting element; and
  - an eighth transistor connecting the driving transistor, the fourth transistor and the seventh transistor, and
- wherein the third transistor and the eighth transistor are connected to the emission signal line.

2. The display device of claim 1, wherein the plurality of level shift circuits include:
- a plurality of first level shift circuits configured to transmit a first mode signal; and
- a plurality of second level shift circuits configured to transmit a second mode signal,
- wherein the active area includes a plurality of areas divided in a row or column direction, and wherein the plurality of first level shift circuits and the plurality of second level shift circuits are each disposed one by one for each of the plurality of areas.

3. The display device of claim 2, wherein the plurality of first level shift circuits and the plurality of second level shift circuits transmit the respective mode signals for each of the plurality of areas.

4. The display device of claim 2, wherein for the plurality of sub-pixels, the plurality of sub-pixel circuits are disposed, and the plurality of first level shift circuits and the plurality of second level shift circuits share signal lines with the plurality of sub-pixel circuits.

5. The display device of claim 2, wherein one first level shift circuit among the plurality of first level shift circuits includes:

a first capacitor;

a second capacitor connected in series with the first capacitor;

a first transistor connected to the first scan signal line and configured to transmit a second mode selection signal to a first electrode of the first capacitor;

a second transistor connected to the first scan signal line and configured to transmit a first mode selection signal to a second electrode of the first capacitor;

a third transistor connected to the second scan signal line and configured to transmit the second mode selection signal to a first electrode of the second capacitor;

a fourth transistor connected to the first scan signal line and configured to transmit the first mode selection signal to a second electrode of the second capacitor;

a fifth transistor connected to the second scan signal line and configured to transmit the first mode selection signal to the second electrode of the second capacitor;

a sixth transistor connected to the emission signal line and configured to transmit the reference voltage to the second electrode of the second capacitor; and a seventh transistor connected to the emission signal line and configured to output the first mode signal.

6. The display device of claim 5, wherein the one first level shift circuit is driven separately into a first period, a second period, and a third period, during the first period, a first scan signal and the second mode selection signal are turn-on signals, during the second period, a second scan signal and the second mode selection signal are turn-on signals, and during the third period, an emission signal and the first mode selection signal are turn-on signals.

7. The display device of claim 2, wherein one second level shift circuit among the plurality of second level shift circuits includes:

a first transistor connected to the first scan signal line and configured to transmit a first mode selection signal to a first electrode of a first capacitor;

a second transistor connected to the first scan signal line and configured to transmit a second mode selection signal to a second electrode of the first capacitor;

a third transistor connected to the second scan signal line and configured to transmit the first mode selection signal to a first electrode of a second capacitor;

a fourth transistor connected to the first scan signal line and configured to transmit the second mode selection signal to a second electrode of the second capacitor;

a fifth transistor connected to the second scan signal line and configured to transmit the second mode selection signal to the second electrode of the second capacitor;

a sixth transistor connected to the emission signal line and configured to transmit the reference voltage to the second electrode of the second capacitor; and a seventh transistor connected to the emission signal line and configured to output the second mode signal.

8. The display device of claim 7, wherein the one second level shift circuit is driven separately into a first period, a second period, and a third period, during the first period, a first scan signal and the first mode selection signal are turn-on signals, during the second period, a second scan signal and the first mode selection signal are turn-on signals, and during the third period, an emission signal and the second mode selection signal are turn-on signals.

9. The display device of claim 2, further comprising:

a plurality of mode control units disposed in the non-active area, wherein the display panel includes:

a first mode selection signal line extending in the row or column direction in the plurality of areas and connected to the plurality of mode control units to transmit a first mode selection signal to the plurality of sub-pixels; and a second mode selection signal line extending in the row or column direction in the plurality of areas and connected to the plurality of mode control units to transmit a second mode selection signal to the plurality of sub-pixels.

10. The display device of claim 2, wherein the plurality of first level shift circuits and the plurality of second level shift circuits are each configured in a same number as the plurality of areas.

11. The display device of claim 1, wherein in the first mode, the fourth transistor is turned on and the seventh transistor is turned off, and in the second mode, the fourth transistor is turned off and the seventh transistor is turned on.

12. The display device of claim 1, wherein the display panel includes a driving transistor and first to eighth transistors, each of the plurality of sub-pixels is driven separately into an initial period, a sampling period, a holding period, and an emission period, during the initial period, a voltage of a gate electrode of the driving transistor is initialized, and an anode electrode of the first light emitting element and an anode electrode of the second light emitting element are initialized, respectively, during the sampling period, a threshold voltage of the driving transistor is sampled, during the holding period, the first to eighth transistors are turned-off, and during the emission period, a driving current to each of the first light emitting element and the second light emitting element is applied so that each of the first light emitting element and the second light emitting element emits light.

13. The display device of claim 1, wherein in the first mode, the first light emitting element emits light, and the light from the first light emitting element is output with a viewing angle limited in a first direction and a second direction by the first optical member, and in the second mode, the second light emitting element emits light, and the light from the second light emitting element is output with a viewing angle limited only in the first direction by the second optical member.

* * * * *